(12) United States Patent
Morita et al.

(10) Patent No.: US 9,647,126 B2
(45) Date of Patent: *May 9, 2017

(54) OXIDE FOR SEMICONDUCTOR LAYER IN THIN FILM TRANSISTOR, THIN FILM TRANSISTOR, DISPLAY DEVICE, AND SPUTTERING TARGET

(71) Applicant: Kobe Steel, Ltd., Kobe-shi (JP)

(72) Inventors: Shinya Morita, Kobe (JP); Kenta Hirose, Kobe (JP); Aya Miki, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 113 days.

This patent is subject to a terminal disclaimer.

(21) Appl. No.: 14/394,530

(22) PCT Filed: May 28, 2013

(86) PCT No.: PCT/JP2013/064807
§ 371 (c)(1),
(2) Date: Oct. 15, 2014

(87) PCT Pub. No.: WO2013/180141
PCT Pub. Date: Dec. 5, 2013

(65) Prior Publication Data
US 2015/0076489 A1    Mar. 19, 2015

(30) Foreign Application Priority Data

May 30, 2012 (JP) .................. 2012-123756
Mar. 29, 2013 (JP) .................. 2013-073723

(51) Int. Cl.
*H01L 29/12* (2006.01)
*H01L 29/786* (2006.01)
(Continued)

(52) U.S. Cl.
CPC .......... *H01L 29/7869* (2013.01); *C23C 14/08* (2013.01); *C23C 14/3414* (2013.01);
(Continued)

(58) Field of Classification Search
CPC .............................................. H01L 29/66969
(Continued)

(56) References Cited

U.S. PATENT DOCUMENTS 8,558,382 B2    10/2013  Maeda et al.
9,324,882 B2 *   4/2016  Goto ................ C23C 14/08
(Continued)

FOREIGN PATENT DOCUMENTS

CN    104335353 A    2/2015
JP    2007-063649 A   3/2007
(Continued)

OTHER PUBLICATIONS

U.S. Appl. No. 14/113,322, filed Oct. 22, 2013, Maeda, et al.
International Search Report and Written Opinion issued Aug. 13, 2013 in PCT/JP2013/064807 filed May 28, 2013.

*Primary Examiner* — Samuel Gebremariam
(74) *Attorney, Agent, or Firm* — Oblon, McClelland, Maier & Neustadt, L.L.P.

(57) ABSTRACT

Provided is an oxide semiconductor configured to be used in a thin film transistor having high field-effect mobility; a small shift in threshold voltages against light and bias stress; excellent stress resistance. The oxide semiconductor has also excellent resistance to a wet-etchant for patterning of a source-drain electrode. The oxide semiconductor comprises In, Zn, Ga, Sn and O, and satisfies the requirements represented by expressions (1) to (4) shown below, wherein [In], [Zn], [Ga], and [Sn] represent content (in atomic %) of each of the elements relative to the total content of all the metal elements other than oxygen in the oxide.

$$(1.67 \times [Zn] + 1.67 \times [Ga]) \geq 100 \qquad (1)$$

$$\{([Zn]/0.95) + ([Sn]/0.40) + ([In]/0.4)\} \geq 100 \qquad (2)$$

$$[In] \leq 40 \qquad (3)$$

$$[Sn] \geq 5 \qquad (4)$$

9 Claims, 9 Drawing Sheets

(51) Int. Cl.
*H01L 21/02* (2006.01)
*H01J 37/34* (2006.01)
*C23C 14/34* (2006.01)
*C23C 14/08* (2006.01)

(52) U.S. Cl.
CPC .... *H01J 37/3429* (2013.01); *H01L 21/02554* (2013.01); *H01L 21/02565* (2013.01); *H01J 2237/332* (2013.01)

(58) Field of Classification Search
USPC .......................................................... 257/43
See application file for complete search history.

(56) References Cited

U.S. PATENT DOCUMENTS

| | | | |
|---|---|---|---|
| 2004/0191530 A1 | 9/2004 | Inoue et al. | |
| 2009/0197757 A1 | 8/2009 | Fukushima | |
| 2009/0308635 A1 | 12/2009 | Yano et al. | |
| 2009/0321732 A1 | 12/2009 | Kim et al. | |
| 2010/0155717 A1* | 6/2010 | Yano | C23C 14/086 257/43 |
| 2010/0170696 A1 | 7/2010 | Yano et al. | |
| 2010/0276685 A1 | 11/2010 | Itagaki et al. | |
| 2011/0121244 A1 | 5/2011 | Yano et al. | |
| 2011/0193083 A1 | 8/2011 | Kim et al. | |
| 2012/0119207 A1 | 5/2012 | Goto et al. | |
| 2013/0009111 A1 | 1/2013 | Morita et al. | |
| 2013/0032798 A1 | 2/2013 | Miki et al. | |
| 2013/0119324 A1 | 5/2013 | Morita et al. | |
| 2013/0181218 A1 | 7/2013 | Maeda et al. | |
| 2013/0228926 A1 | 9/2013 | Maeda et al. | |
| 2013/0234081 A1 | 9/2013 | Goto et al. | |
| 2013/0240802 A1 | 9/2013 | Miki et al. | |
| 2013/0248855 A1 | 9/2013 | Miki et al. | |
| 2013/0248858 A1 | 9/2013 | Morita et al. | |
| 2013/0270109 A1 | 10/2013 | Morita et al. | |
| 2013/0306469 A1 | 11/2013 | Kanamaru et al. | |
| 2013/0313110 A1 | 11/2013 | Iwasaki et al. | |
| 2013/0334039 A1 | 12/2013 | Goto et al. | |
| 2013/0341183 A1 | 12/2013 | Goto et al. | |
| 2013/0341617 A1 | 12/2013 | Tao et al. | |
| 2014/0054588 A1 | 2/2014 | Maeda et al. | |

FOREIGN PATENT DOCUMENTS

| | | |
|---|---|---|
| JP | 2007-123699 A | 5/2007 |
| JP | 2008-063214 A | 3/2008 |
| JP | 2009-164393 A | 7/2009 |
| JP | 2010-016347 A | 1/2010 |
| JP | 2010-21333 A | 1/2010 |
| JP | 2010-118407 A | 5/2010 |
| JP | 2011-108873 A | 6/2011 |
| JP | 2012-026039 A | 2/2012 |
| WO | 03/008661 A1 | 1/2003 |
| WO | 2007/037191 A1 | 4/2007 |
| WO | 2011/126093 A1 | 10/2011 |

\* cited by examiner

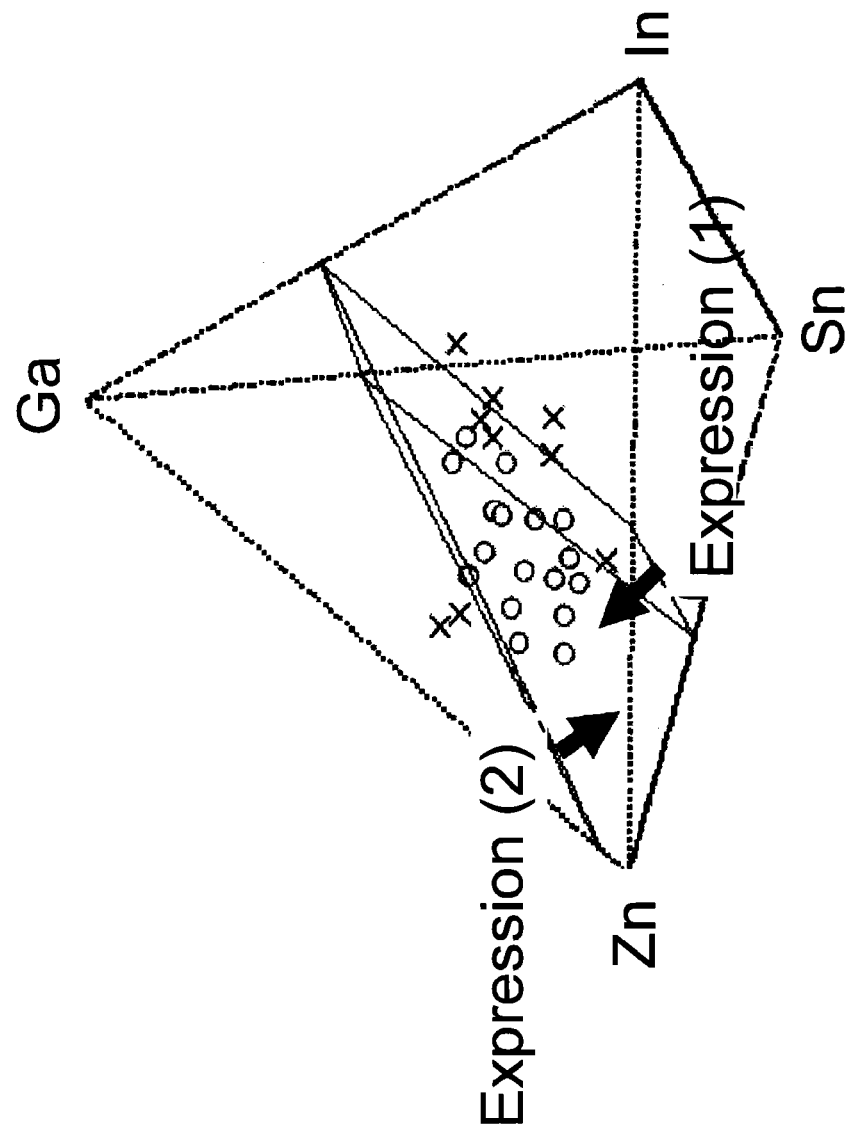

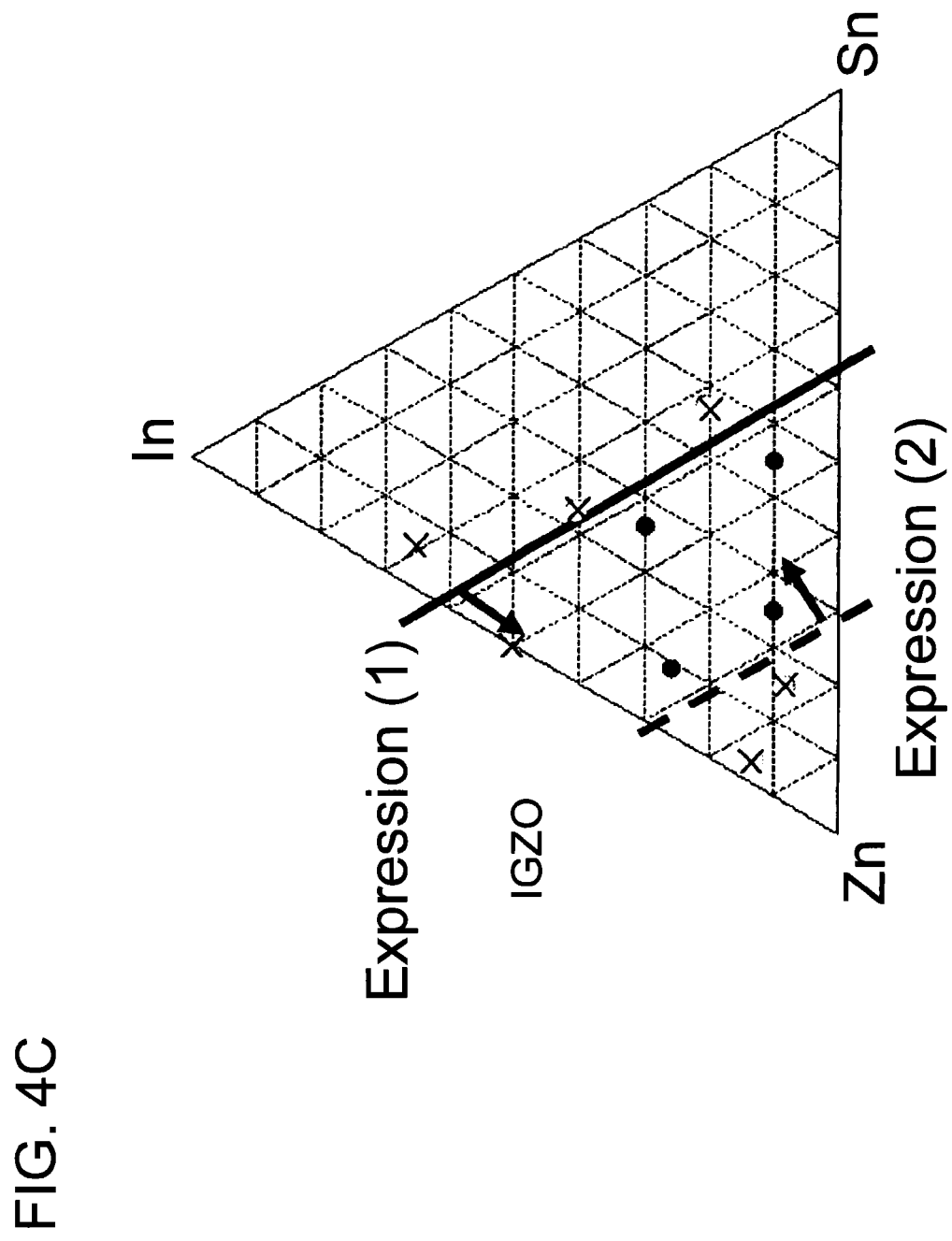

OXIDE FOR SEMICONDUCTOR LAYER IN THIN FILM TRANSISTOR, THIN FILM TRANSISTOR, DISPLAY DEVICE, AND SPUTTERING TARGET

FIELD OF TECHNOLOGY

The present invention relates to an oxide for semiconductor layer in a thin film transistor (TFT) used in display devices such as liquid crystal displays and organic EL displays; a thin film transistor having the oxide; a display device having the thin film transistor; and a sputtering target used in deposition of the oxide.

BACKGROUND ART

As compared with widely used amorphous silicon (a-Si), amorphous (non-crystalline), oxide semiconductors have high carrier mobility (also called as field-effect mobility, which may hereinafter be referred to simply as "mobility"), wide optical band gaps, and film formability at low temperatures, and therefore, have highly been expected to be applied for next generation displays, which are required to have large sizes, high resolution, and high-speed drives; resin substrates having low heat resistance; and others.

In the oxide semiconductors, amorphous oxide semiconductors consisting of indium, gallium, zinc and oxygen (In—Ga—Zn—O, which may hereinafter be referred to as "IGZO") have preferably been used, in particular, because of their having extremely high carrier mobility. For example, non-patent literature documents 1 and 2 disclose thin film transistors (TFTs) in which a thin film of an oxide semiconductor having an In:Ga:Zn ratio equal to 1.1:1.1:0.9 (atomic % ratio) was used as a semiconductor layer (active layer).

When an oxide semiconductor is used as a semiconductor layer of a thin film transistor, the oxide semiconductor is required to have a high carrier concentration and a high mobility and excellent TFT switching properties (transistor characteristics or TFT characteristics). Specifically, the oxide semiconductor is required to have (1) a high on-state current (i.e., the maximum drain current when a positive voltage is applied to both a gate electrode and a drain electrode); (2) a low off-state current (i.e., a drain current when a negative voltage is applied to the gate electrode and a positive voltage is applied to the drain voltage, respectively); (3) a low S value (Subthreshold Swing, i.e., a gate voltage needed to increase the drain current by one digit); (4) a stable threshold value (i.e., a voltage at which the drain current starts to flow when a positive voltage is applied to the drain electrode and either a positive voltage or a negative voltage is applied to the gate voltage, which voltage may also be called as a threshold voltage) showing no change with time (which means that the threshold voltage is uniform in the substrate surface); and (5) a high mobility.

Furthermore, TFTs using an oxide semiconductor layer such as IGZO are required to have excellent resistance to stress such as voltage application and light irradiation (stress resistance). It is pointed out that, for example, when a voltage is continuously applied to the gate electrode or when light in a blue emitting band in which light absorption arises is continuously irradiated, electric charges are trapped on the boundary between the gate insulating film and the semiconductor layer of a thin film transistor, resulting in a variation of switching characteristics, such as a shift of the threshold voltage. In addition, for example, when a liquid crystal display panel is driven or when a negative bias is applied to the gate electrode to turn on a pixel, the TFT is irradiated with light leaked out from the liquid crystal cell, and this light gives stress to the TFT to cause deterioration in the characteristics. Indeed, when a thin film transistor is used, a variation of switching characteristics due to stress by voltage application causes deterioration of reliability in a display devices itself.

Similarly in an organic EL display panel, the semiconductor layer is irradiated with light leaked out from a light emission layer, and this light gives stress to the TFT to cause deterioration in the characteristics such as a variation of threshold voltage.

Such a shift of threshold voltage of the TFT deteriorates the reliability of display devices such as a liquid crystal display and an organic EL display. Therefore, an improvement in the stress resistance (a small variation before and after the stress tests) is eagerly desired.

In the course of fabrication process of a thin film transistor substrate having the oxide semiconductor thin film and a source-drain electrode on top of the thin film, the oxide semiconductor is further required to have high resistance to a wet etchant. Since different kinds of wet etchants are used in each processing steps of a TFT, the oxide semiconductor is specifically required to possess the following two characteristics.

(1) Excellent Solubility into a Wet Etchant for Processing the Oxide Semiconductor It is required for the oxide semiconductor to be etched at an appropriate rate by an organic acid-based wet etchant such as oxalic acid which is used in processing oxide semiconductor films so that the oxide semiconductor is patterned without a residue.

(2) Insolubility into a Wet Etchant for the Source-Drain Electrodes

A source electrode and a drain electrode formed on top of the oxide semiconductor film are etched at an appropriate rate by an inorganic-based wet etchant including such as for example phosphoric acid, nitric acid, and acetic acid, used for processing the source and drain electrode interconnection films. It is required for a surface (a side of back channel) of the oxide semiconductor film not to be etched or damaged by the wet etchant so that the oxide semiconductor is not deteriorated in terms of the TFT characteristics and stress resistance.

While degree of etching (etching rate) is generally dependent of kind of wet etchant, the IGZO shows an excellent solubility to wet etchant such as oxalic acid, i.e., excellent in adaptability to wet etching process of the oxide semiconductor layer. The oxide semiconductor, however, also shows high solubility into inorganic acid-based wet etchants, and is extremely easily etched by the inorganic acid-based wet etchant solutions. If the IGZO film is dissolved in the wet etching process of the source-drain electrode, fabrication of TFT then becomes difficult, and the TFT characteristics are deteriorated. In other words, IGZO is inferior in terms of (B) the durability in a wet etchant for the source-drain electrode. In an attempt to solve the problem, use of an etchant (a mixed solution of $NH_4F$ and $H_2O_2$) which does not etch IGZO is under consideration. However, the wet etchant is unstable and shows a short life-time, and deteriorates the productivity.

The deterioration of TFT characteristics accompanying a wet etching of source-drain electrode in case (B) may be particularly observed in a TFT of back channel etch (BCE) structure.

There are two types in thin film transistors of bottom-gate structure comprising an oxide semiconductor; one is an etch stop (ESL) type with an etch stopper layer 9 as shown in FIG. 1A, while the other is a back channel etch (BCE) type without an etch stopper layer as shown in FIG. 1B. The same numbers are given to components which are common in both of the figures wherein 1 refers to a substrate, 2 a gate electrode, 3 a gate insulating film, 4 an oxide semiconductor layer, 5 a source-drain electrode, 6 a passivation film (an insulating film), 7 a contact hole, and 8 a transparent conductive film.

The etch stopper layer 9 shown in FIG. 1A is formed for the purpose of preventing deterioration of TFT characteristics by damaging the oxide semiconductor layer 4 in the course of etching the source-drain electrode 5. Excellent TFT characteristics are likely to be secured by the structure shown in FIG. 1A as it reduces damages on the surface of oxide semiconductor layer in the course of fabricating a source-drain electrode. An insulating film such as $SiO_2$ is usually used for the etch stopper layer.

The TFT shown in FIG. 1B, on the other hand, is suited to simplify fabrication process because of absence of an etch stopper layer, and is thus superior in terms of productivity. It is possible to avoid damaging the oxide semiconductor layer 4 during the etching step even without the etch stopper layer by choosing fabrication process. For example, an etch stopper layer is not necessary when fabricating a source-drain electrode 5 by a lift-off method, as the oxide semiconductor layer 4 is not damaged. In such a case a BCE type transistor as shown in FIG. 1B is adopted. The BCE type transistor structure shown in FIG. 1B may also be employed when a wet etching solution that is particularly developed to secure excellent TFT characteristics without an etch stopper layer is used in the fabrication process.

From the point of view of reducing fabrication cost and simplifying the process it is recommended as described above to adopt a BCE-type transistor which does not require an etch stopper layer as illustrated in FIG. 1B. However, the aforementioned issue regarding wet etching is strongly concerned. On the other hand, even in an ESL-type transistor shown in FIG. 1A, the aforementioned issue may arise depending on kind of etch etchant solution used in the fabrication process.

Considering the problem, Patent Document 1 discloses a technology to enhance resistance to an inorganic-based wet etchant such as for example a mixed wet-etching solution of phosphoric acid, nitric acid, and acetic acid, used for processing the source and drain electrodes, and to inhibit a semiconductor layer from being eroded, by adding a predetermined amount of Sn to IGZO. Specifically, it is disclosed in an example of Table 2 in Patent Document 1 that undesirable deviation (or distribution) of TFT characteristics is suppressed in a BCE-type thin film transistor comprising a semiconductor layer in which atomic ratio of Sn relative to the total content of In, Ga, Zn, and Sn, is controlled in a range from 0.015 to 0.070 (from 1.5 to 7%). However, improving the stress resistance is not considered at all in Patent Document 1.

PRIOR ART DOCUMENTS

Patent Document

Patent Document 1: Japanese Patent Laid-open Publication No. 2011-108873

Non-Patent Literature Document

Non-patent Literature Document 1: Solid State Physics, Vol. 44, p. 621 (2009)
Non-patent Literature Document 2: Nature, Vol. 432, p. 488 (2004)

SUMMARY OF THE INVENTION

Problems to be Solved by the Invention

The present invention has been completed under the circumstances described above, and one object of the present invention is to provide a thin film transistor comprising an oxide semiconductor layer, having high field-effect mobility and high resistance to light and biasing stresses to have a small variation of threshold voltage. Another object of the present invention is to provide an oxide for semiconductor layer having excellent resistance to wet etchants which are used for patterning source/drain electrodes, as well as a sputtering target used for deposition of the oxide for semiconductor layer, a thin film transistor having the oxide for semiconductor layer, and a display device having the thin film transistor.

Means for Solving the Problems

The oxide for a semiconductor layer of the present invention to be able to solve the problem, in a thin film transistor having a source electrode, a drain electrode, a gate electrode, a gate insulating film, a semiconductor layer, and a passivation film, on a substrate, comprises In, Zn, Ga, Sn, and O; and satisfies the requirements represented by expressions (1) to (4) shown below, wherein [In], [Zn], [Ga] and [Sn] represent the content (atomic %) of the respective element relative to the total content of all the metal elements other than oxygen in the oxide.

$$(1.67 \times [Zn] + 1.67 \times [Ga]) \geq 100 \quad (1)$$

$$\{([Zn]/0.95) + ([Sn]/0.40) + ([In]/0.4)\} \geq 100 \quad (2)$$

$$[In] \leq 40 \quad (3)$$

$$[Sn] \geq 5 \quad (4)$$

In a preferred embodiment of the present invention, the oxide for a semiconductor layer further satisfies the requirements represented by expressions (5) to (8) shown below.

$$12 \leq [In] \leq 20 \quad (5)$$

$$17 \leq [Sn] \leq 25 \quad (6)$$

$$15 \leq [Ga] \leq 20 \quad (7)$$

$$40 \leq [Zn] \leq 50 \quad (8)$$

The carrier concentration of the oxide for semiconductor layer of the present invention is preferably from $1 \times 10^{15}$ to $1 \times 10^{17}/cm^3$.

The present invention also encompasses a thin film transistor comprising the oxide for semiconductor layer as a semiconductor layer of the thin film transistor. In a preferred embodiment of the thin film transistor of the present invention, density of the semiconductor layer is greater than or equal to $6.0/cm^3$.

The present invention further encompasses a display device having the thin film transistors as described above.

A sputtering target of the present invention is to be used for formation of any one of the oxide for semiconductor layer; comprising In, Zn, Ga, Sn, and O; and satisfying the requirements represented by expressions (1) to (4) shown below, wherein [In], [Zn], [Ga] and [Sn] represent the content (atomic %) of the respective element relative to the total content of all the metal elements other than oxygen in the oxide.

$$(1.67\times[Zn]+1.67\times[Ga])\geq 100 \quad (1)$$

$$\{([Zn]/0.95)+([Sn]/0.40)+([In]/0.4)\}\geq 100 \quad (2)$$

$$[In]\leq 40 \quad (3)$$

$$[Sn]\geq 5 \quad (4)$$

In a preferred embodiment of the present invention, the sputtering target further satisfies the requirements represented by expressions (5) to (8) shown below.

$$12\leq[In]\leq 20 \quad (5)$$

$$17\leq[Sn]\leq 25 \quad (6)$$

$$15\leq[Ga]\leq 20 \quad (7)$$

$$40\leq[Zn]\leq 50 \quad (8)$$

Effects of the Invention

The present invention can provide an oxide to be used as a semiconductor layer in a thin film transistor having high mobility, switching characteristics, stress resistance shown by a small variation of threshold voltage before and after applying the light irradiation and the electrically negative biasing. In addition, the oxide is superior in terms of the durability in a wet etchant used for patterning a source-drain electrode. A display device of high reliability can be provided by employing a thin film transistor comprising the oxide of the present invention.

As described hereinabove, the oxide of the present invention is suitably used for a thin film transistor of BCE structure in particular due to its excellent resistance to wet etching. However, it is not limited only to the BCE structure. The oxide is also applicable to a thin film transistor of ESL structure. It can exhibit superior characteristics regardless of the kind of wet etchant.

BRIEF DESCRIPTION OF DRAWING

FIG. 2C shows the region satisfying the requirements of the expressions (1) and (2) and the data points of evaluation regarding stress resistance and mobility.

FIG. 4C is an In—Zn—Sn phase diagram with data points of Nos. 17 to 24 of Table 1 ([Ga] is larger than or equal to 30 atomic % but smaller than 40 atomic %) in Example 1, indicating a region satisfying the relationship specified by the expressions (1) and (2) by arrows.

MODE FOR CARRYING OUT THE INVENTION

Figure 1A:
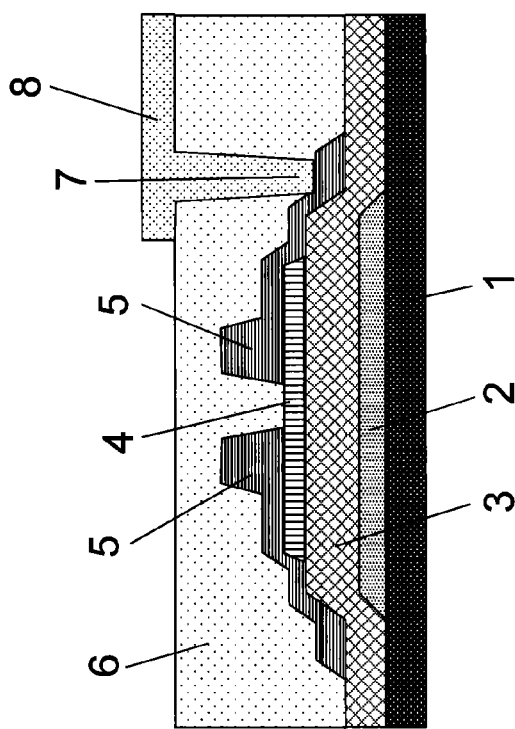
FIG. 1A is a schematic cross-sectional view for explaining an etch stop (ESL) type TFT comprising an oxide semiconductor layer and an etch stopper layer.

The present inventors have made various studies to improve TFT characteristics, stress resistance and durability in wet etching when an oxide (IGZO) containing In, Ga, and Zn is used for active layers (semiconductor layers) of the TFTs. As a result, the present inventors have found that an intended object can be achieved by the use of IZGTO in which the amount of metal elements constituting the oxide are appropriately controlled for semiconductor layers of TFTs, thereby completing the present invention. It is noted that IZGTO is an IGZO semiconductor to which Sn is added.

In the present specification, an oxide constituted of In, Zn, Ga, Sn and O is occasionally abbreviated to IZGTO.

The oxide for semiconductor according to the present invention is used for a semiconductor layer in a thin film transistor having a source electrode, a drain electrode, a gate electrode, a gate insulating film, a semiconductor layer, and a passivation film, on a substrate; comprising In, Zn, Ga, Sn, and O; and satisfying the requirements represented by expressions (1) to (4) shown below, wherein [In], [Zn], [Ga] and [Sn] represent the content (atomic %) of the respective element relative to the total content of all the metal elements other than oxygen in the oxide.

$$(1.67\times[Zn]+1.67\times[Ga])\geq 100 \quad (1)$$

$$\{([Zn]/0.95)+([Sn]/0.40)+([In]/0.4)\}\geq 100 \quad (2)$$

$$[In]\leq 40 \quad (3)$$

$$[Sn]\geq 5 \quad (4)$$

In the present specification, [In] represents the content of In (in atomic %) relative to the total content of all the metal elements (In, Zn, Ga, and Sn) other than oxygen (O). Similarly, [Zn], [Ga] and [Sn] represent the content of Zn, Ga, and Sn (in atomic %) relative to the total content of all the metal elements (In, Zn, Ga, and Sn) other than oxygen (O), respectively.

In the present specification, the wording "excellent in TFT characteristics" means that the threshold voltage ($V_{th}$) and the field-effect mobility ($\mu_{FE}$) measured by each method explained in Examples below respectively satisfies $V_{th}$ (in the absolute value of) is smaller than or equal to 5 V and $\mu_{FE}$ is larger than or equal to 4.9 cm$^2$/Vs.

In the present specification, the wording "excellent in stress resistance" means that the threshold voltage shift (the absolute value of $\Delta V_{th}$) is smaller than or equal to 4.8 V, after an stress biasing test conducted under a condition described below in Examples. Specifically, the stress biasing test was conducted for 2 hours by continuously applying negative bias onto the gate electrode under white light irradiation.

In the present specification, the wording "excellent in wet etching property" means that the source-drain electrode is properly etched when it is subjected to a wet etchant for patterning while the oxide semiconductor layer is not soluble to the wet etchant. As described hereinafter in Examples in the present specification, etching rate was measured for the oxide semiconductors deposited on a substrate when they were subjected to a wet etchant solution for a source-drain electrode for patterning for the purpose of simplification of the measurement. Specifically, a mixed-acid etchant (phosphoric acid:nitric acid:acetic acid=70:2:10) was used as the etchant for the wet etching. In the present invention, oxide semiconductors having a measured etching rate of smaller than or equal to 1 Å/sec were evaluated as ""excellent in wet etching property". It is difficult for the wet etchant to etch the oxide semiconductors having an etching rate in the specified range. Therefore, the surface (a side of back channel) of the oxide semiconductor film not likely to be etched or damaged by the wet etchant so that the oxide semiconductor is not deteriorated in terms of the TFT characteristics and stress resistance.

The oxide for the semiconductor layer of the present invention is explained in detail hereinbelow.

As described above, the oxide for the semiconductor layer (the oxide semiconductor thin film) is an amorphous oxide consisting of In, Zn, Ga, Sn, and O (IZGTO), and satisfies the requirements represented by expressions (1) to (4).

IGZO consisting of In, Zn, Ga, and O is well known as an oxide for a semiconductor layer as described above. Among these elements, it is considered that In contributes to improvement of the electrical conductivity, Ga contributes to suppression of oxygen deficiency, Zn contributes to stabilization of the amorphous structure.

The present inventors conducted studies and found that, by adopting IZGTO, an oxide made by adding Sn to the above-mentioned IGZO, and;

(i) by satisfying the expression (1) composed of Zn and Ga, the stress resistance is mainly improved as demonstrated by $\Delta V_{th}$ of smaller than or equal to 4.8 V, (ii) by satisfying the expression (2) composed of Zn, Sn, and In, the mobility is mainly improved as demonstrated by $\mu_{FE}$ of larger than or equal to 4.9 cm²/Vs, (iii) by satisfying the expression (3) which specifies the ratio of In relative to all the metal elements ([In]), the TFT characteristics and the stress resistance are mainly improved, and (iv) by satisfying the expression (4) which specifies the ratio of Sn relative to all the metal elements ([Sn]), mainly the durability in wet etching process, and the TFT characteristics, the stress resistance, and the mobility are improved. And the inventors completed the present invention by finding that an oxide semiconductor layers having all the desired characteristics can be obtained by controlling the chemical composition of IZGTO so as to satisfy all of the expressions (1) to (4).

Figure 2A:
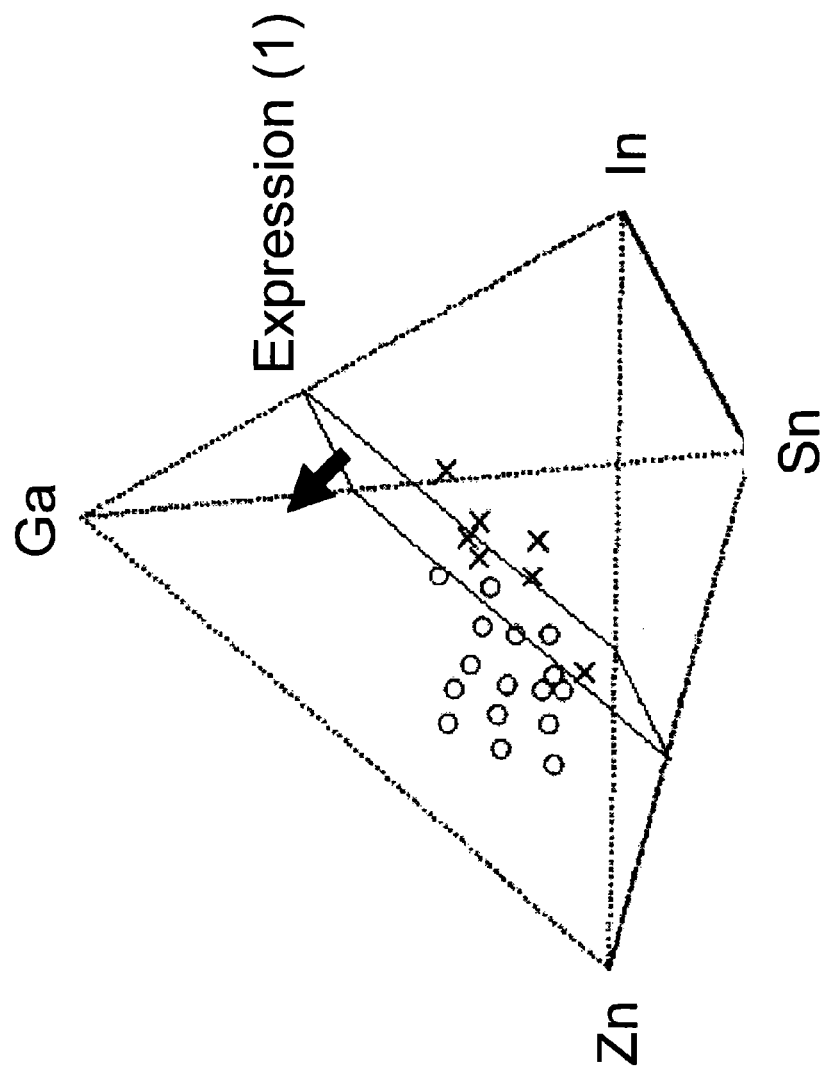
FIG. 2A shows the region satisfying the requirement of the expression (1) and the data points of evaluation regarding stress resistance.

For the purpose of reference, the region satisfying the expression (1) and results of the evaluation (A, B, D) regarding the stress resistance are shown in a graph of FIG. 2A based on results of Examples described hereinafter. In FIG. 2A, data points for which the stress resistance was evaluated as "A" or "B" are plotted by "○", while those for which the stress resistance was evaluated as "D" are indicated by "×". It is elucidated that those satisfying the expression (1) show good stress resistance as indicated in FIG. 2A.

Figure 2B:
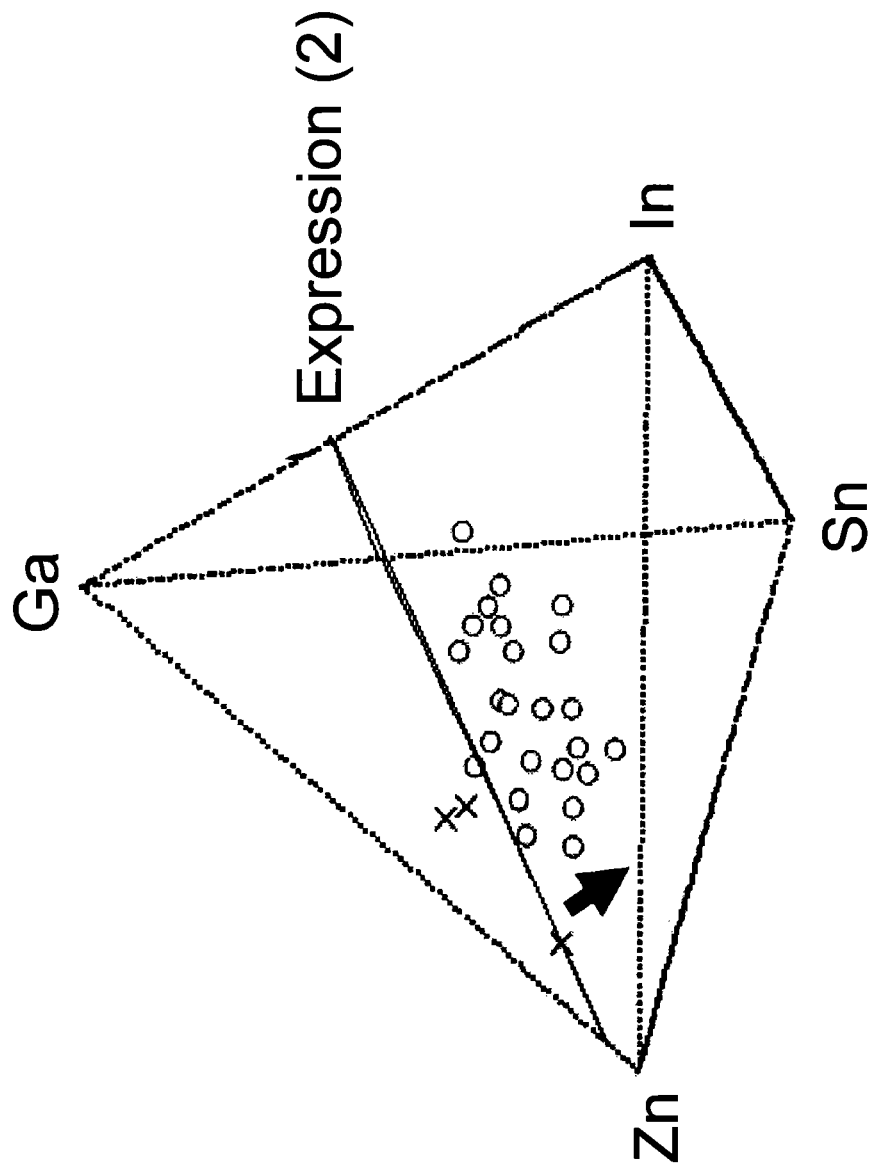
FIG. 2B shows the region satisfying the requirement of the expression (2) and the data points of evaluation regarding mobility.

The region satisfying the expression (2) and results of the evaluation (A, B, D) regarding the mobility are shown in a graph of FIG. 2B based on results of Examples described hereinafter. In FIG. 2B, data points for which the mobility was evaluated as "A" or "B" are plotted by "○", while those for which the mobility was evaluated as "D" are indicated by "×". It is elucidated that those satisfying the expression (2) have high mobility as shown in FIG. 2B.

The region satisfying both of the expressions (1) and (2) and results of the evaluations regarding the stress resistance and the mobility are shown in a graph of FIG. 2C. In FIG. 2C, data points for which both the stress resistance and the mobility were evaluated as "A" or "B" are plotted by "○", while those for which either the stress resistance or the mobility or both of them was evaluated as "D" are indicated by "×". It is elucidated that those satisfying both of the expressions (1) and (2) show excellent stress resistance and high mobility as indicated in FIG. 2C.

Firstly, the expression (1) is explained as follows. Among the metal elements constituting IZGTO, the expression (1) is composed of Zn and Ga which contribute to enhancement of the stress resistance. As described in Examples below, it was found that the variation of threshold voltage before and after applying the light irradiation exceeds 4.8 V and the stress resistance is deteriorated in oxide semiconductors which do not satisfy the expression (1) even if the oxide layers fulfill the other requirements specified in the present invention.

The expression (1) was derived as follows. It has been known that deterioration of TFT characteristics under stresses such as voltage biasing and light irradiation is induced by generation of defects within the semiconductor itself or at the interface between the semiconductor and the gate insulating film in the course of putting the stress on. As for the gate insulating film, insulators such as $SiO_2$, $Si_3N_4$, $Al_2O_3$, and $HfO_2$ are widely used. It is considered that the defects are likely to be generated particularly at such a hetero-interface of a semiconductor layer and an insulating film. It is thus considered of vital importance for the purpose of improving the stress resistance to make consideration and control the interface between a semiconductor and an insulating film. From a lot of fundamental experiments conducted by the present inventors, it was unveiled that the stress resistance is degraded when ratios of In and Sn relative to all the metal elements of In, Ga, Zn, and Sn in IZGTO are increased, and that the stress resistance is enhanced when ratios of Ga and Zn in IZGTO are increased. It is deduced that increasing the content ratios of Ga and Zn contribute to stabilizing the structure of IZGTO and to suppressing oxygen deficiency which causes degradation of the reliability.

In order to even more effectively exert the effect, the left hand side value of the expression (1): (1.67×[Zn]+1.67×[Ga]) is preferably larger than or equal to 103, and more preferably larger than or equal to 105. On the other hand, it is preferable to control the left hand side value to about 150 or smaller because excessively large left hand side value induces decrease of the carrier density and the lowering the field-effect mobility. The left hand side value is more preferably smaller than or equal to 142. Concretely, it is preferable to set it to an appropriate range with a consideration of balance with the expressions (2) to (4) explained hereinbelow.

Next, the expression (2) is explained as follows. Among the metal elements constituting IZGTO, the expression (2) is composed of Zn, Sn, and Ga which mainly contribute to enhancement of the mobility. As described in Examples below, it was found that, depending on the content of Zn relative to all the metal elements ([Zn]), the mobility was decreased and the desirable stress resistance may not be secured in oxide semiconductors which do not satisfy the expression (2) even if the oxide layers fulfill the other requirements specified in the present invention.

The expression (2) was derived as follows. The present inventors conducted a detailed study on relations between each of the metals; In, Ga, Zn, and Sn and mobility. It was found that by increasing the contents of Ga and Zn relative to all the metal elements of In, Ga, Zn, and Sn, the contents of In and Sn which play a role of electron conduction path relatively decrease, which result in decrease of the mobility (see FIG. 4 shown below). The present inventors conducted further studies based on the finding, and found that the expression (2) defined by Zn, Sn, and In except Ga, is an effective index of improvement of the mobility.

According to the result of studies conducted by the present inventors, it was elucidated that the carrier density in the oxide semiconductor was increased, the oxide became a conductor, and the semiconductor characteristics were lost when the content ratios of In and Sn relative to all the metal elements of In, Ga, Zn, and Sn were increased. It was also found, on the other hand, that when the content ratios of In and Sn relative to all the metal elements of In, Ga, Zn, and Sn were decreased and the content ratios of Zn and Ga were relatively increased, the conduction paths for electrons were decreased and the mobility was lowered even if the fabricated TFT showed the switching behavior. It was further found that Zn also contributed to improvement of the mobility since it stabilizes the amorphous structure of the oxide semiconductor. It was thus found necessary to control the ratios of the elements relative to all the metal elements to a proper range in order to secure both of the switching characteristics and high mobility. The present inventors accumulated even more of fundamental experimental results, and defined the expression (2) which is related to improvement of the mobility, accordingly. By the way, it is essential to control the ratios of In and Sn relative to all the metal elements to a predetermined range or smaller. This is, however, indirectly controlled by controlling the ratios of Ga and Zn so that they satisfy the relationship defined by the expression (1).

In order to even more effectively exert the effect, the left hand side value of the expression (2); $(([Zn]/0.95)+([Sn]/0.40)+([In]/0.4))$ is preferably larger than or equal to 103, and more preferably larger than or equal to 105. Excessively large left hand side value of the expression (2), however, makes chemical bonding of the oxide in the semiconductor unstable, resulting in undesirable deviation of TFT characteristics and degradation in stress resistance to light irradiation and electrical biasing. The left hand side value of the expression (2) is preferably controlled to approximately 180 or smaller, accordingly. The left hand side value of the expression (2) is more preferably 160 or smaller. Specifically, it is preferable to set it to an appropriate range for the left hand side value of the expression (2) with a consideration of balance with the expressions (1), and (3) and (4) explained below so that the desirable properties are effectively exerted.

The expression (3) specifies [In] the amount of In in all the metal elements. Along with the expression (1), it is an expression mainly indicating contribution to the improvement in the stress resistance. It was found by detailed studies on transistor characteristics of IZGTO conducted by the present inventors that, with increasing the amount of In in all the metal elements, the mobility showed an upward trend. It was also found in the meantime that excessively large amount of In induced an increase of the carrier density, a significantly large shift of the threshold voltage ($V_{th}$) toward negative side, resulting in normally on-state of the transistor. It is generally preferable for in transistor characteristics that the threshold voltage is as close as possible to around 0 V. It was determined to control the amount of In in all the metal elements to smaller than or equal to 40% as indicated by the expression (3), accordingly.

In order to even more effectively exert the effect of In, [In], the left hand side value of the expression (3) is preferably smaller than or equal to 35, and more preferably smaller than or equal to 30%. On the other hand, it is preferable to control [In] to about 5% or larger because excessively small [In] induces decrease of the carrier density, decrease of the conduction path for electrons in the oxide semiconductor, and lowering the field-effect mobility. [In] is more preferably larger than or equal to 10%. Specifically, it is preferable to set it to an appropriate range with a consideration of balance with the expressions (1), (2), and (4) explained hereinbelow so that the desirable properties are effectively exerted. It is particularly preferable with a consideration of balance with the expressions (1) to (4) that [In] is within a range which satisfies the expression (5) shown below.

$$12 \leq [In] \leq 20 \tag{5}$$

The expression (4) specifies [Sn], the amount of Sn in all the metal elements. It is an expression specified mainly from the point of view to improvement of the durability in wet etching process. As described in Examples below, it was found that the wet etching rate was increased in oxide semiconductors which do not satisfy the expression (4) even if the oxide layers fulfill the other requirements specified in the present invention. The increase of etching rate deteriorates the TFT characteristics as it induces reduction in thickness and increase of surface damages in the thin film constituting the source-drain electrode during the wet etching.

According to studies conducted by the present inventors, it was further found that the predetermined amount of Sn added to IGZO was effective to improve the mobility as well as to decrease the etching rate in a wet etchant solution used in fabrication processes of a TFT as described above. It was also found that the predetermined amount of Sn was effective to improve the chemical stability as exemplified in reduction of damages on the surface of oxide semiconductor by the etchant as well as to improve the stress resistance.

In order to even more effectively exert the effect, [Sn], the left hand side value of the expression (4), is preferably larger than or equal to 6%, and more preferably larger than or equal to 8%. On the other hand, it is preferable to control [Sn] to about 50% or smaller because excessively large [Sn] makes the oxide semiconductor insoluble to organic acid solutions such as oxalic acid which is widely used for a wet etchant for processing oxide semiconductors. The left hand side value is more preferably smaller than or equal to 40%. Specifically, it is preferable to set it to an appropriate range with a consideration of balance with the expressions (1) to (3) so that the desirable properties are effectively exerted. It is particularly preferable with a consideration of balance with the expressions (1) to (4) that [Sn] is within a range which satisfies the expression (6) shown below.

$$17 \leq [Sn] \leq 25 \tag{6}$$

It is further preferable to appropriately control [Ga] the content of Ga relative to the total content of all the metal elements in the oxide for the semiconductor layer according to the present invention on the presumption that the oxide semiconductor satisfies the relationships defined by the expressions (1) to (4). Specifically, it is preferable to control [Ga] to a range from about 10% to 40%. If [Ga] is smaller than 10%, the chemical bonding to oxygen becomes unstable and the light stress resistance is deteriorated. If [Ga] is larger than 40%, on the other hand, the carrier density is decreased and the mobility decreases. It is particularly preferable that [Ga] is within a range which satisfies the expression (7) shown below.

$$15 \leq [Ga] \leq 20 \quad (7)$$

It is further preferable to appropriately control the content of Zn ([Zn]) relative to the total content of all the metal elements in the oxide for the semiconductor layer according to the present invention on the presumption that the oxide semiconductor satisfies the relationships defined by the expressions (1) to (4). Specifically, it is preferable to control [Zn] to a range from about 10% to 80%. If [Zn] is smaller than 10%, the amorphous structure becomes unstable and the TFT lose the switching characteristics. If [Zn] is larger than 80%, on the other hand, the oxide semiconductor film is crystallized and the mobility is decreased due to relative decrease of [In] and [Sn]. It is particularly preferable that [Zn] is within a range which satisfies the expression (8) shown below.

$$40 \leq [Zn] \leq 50 \quad (8)$$

In a preferred embodiment, the oxide for semiconductor layers of the present invention satisfies all the requirements of expressions (5) to (8) at the same time.

Though the aforementioned patent document 1 is also in connection with IZGTO which is excellent in terms of durability in wet etching process as for the present invention, Patent Document 1 is significantly different from the present invention as follows.

Firstly, what the durability in wet etching process means significantly different from each other between the present invention and the invention disclosed in Patent Document 1. As explained above, in the present invention, the durability in wet etching process means that the oxide semiconductor layer is insoluble to a wet etchant solution for processing the source-drain electrode. In Patent Document 1, on the other hand, the durability in wet etching process means that the oxide semiconductor layer is likely to be etched in a wet etchant solution for processing oxide semiconductors represented by oxalic acid or the like. In other words, the property is properly represented to mean that the oxide shows a high etching rate when it is subjected to organic-based etchant solution such as oxalic acid. As a matter of fact, in Examples of Patent Document 1, "processing compatibility of thin films" was evaluated by subjecting the films to an oxalic acid-based wet etchant solution, ITO-06N available from Kanto Chemical Co., Inc., and categorized the oxide semiconductors to "possible" for those having an etching rate of larger than or equal to 50 nm/min at 35° C., "difficult" for those having an etching rate of larger than or equal to 20 nm/min but smaller than 50 nm/min, "impossible" for those showing an etching rate of smaller than 20 nm/min. Based on the standard of evaluation, IGZTO containing [Sn] of 10% or larger is excluded from the scope of the invention because of deterioration of the aforementioned properties. According to the studies conducted by the present inventors, however, it was revealed that the durability in wet etching process defined by the present invention was deteriorated and the desirable wet etching rate was not secured if [Sn] was smaller than 5% (see No. 26 in Table 1 in Example explained below). It was confirmed that oxide semiconductors having a chemical composition fulfilling the requirements of the present invention had high etching rates in an organic-based etchant such as oxalic acid, and were excellent in the wet etching property defined by Patent Document 1 as well.

Further, actual ranges of chemical composition of IZGTO are different from each other as the invention disclosed in Patent Document 1 did not consider improving the stress resistance at all. Concretely, as explained above, the range of [Sn] is different from each other as [Sn] was 7% or smaller in Examples of Patent Document 1. In addition, the range of [In] and the preferred range of [Ga] are different from the present invention as [In] was 40% or larger and the preferred range of [Ga] was 20 to 40% in Patent Document 1. The experiment fact was that due to small [Sn], not only the durability in wet etching process specified in the present invention but also the desirable stress resistance were not secured when the experiments were conducted by using the IZGTO disclosed in Patent Document 1 (refer to No. 26 in Table 1 in Example described below). From there results, it was found that merely individually controlling the respective ratio relative to all the metal elements constituting IGZTO, as for Patent Document 1, was insufficient to satisfy all the desirable properties specified in the present invention. It was further elucidated extremely essential to control the chemical composition of the oxide semiconductor to satisfy the range defined by the expressions (1) and (2) constituted with more than one metal element.

The above is the explanation of the oxide semiconductor layer to be used in the present invention.

The oxide semiconductor layer as described above may preferably be formed by a sputtering method using a sputtering target (which may hereinafter be referred to as the "target"). The supporting method facilitates formation of a thin film having excellent in-plane uniformity in terms of chemical composition and film thickness. The oxide can also be formed by a chemical film-formation method such as a coating method.

As a target to be used in the sputtering method, there may preferably be used a sputtering target containing the elements described above and having the same composition as that of a desired oxide, thereby making it possible to form a thin film showing small deviation of composition and having the same composition as that of the desired oxide. More specifically, an oxide target comprising In, Ga, Zn, and Sn, which satisfies the expressions (1) to (4) (more preferably the expressions (1) to (8)) is preferably used as the sputtering target.

Alternatively, the deposition of a film may also be carried out by a co-sputtering method in which two targets having different chemical compositions are simultaneously discharged. For example, sputtering targets comprising oxides of each element of In, Ga, Zn, and Sn such as $In_2O_3$, $ZnO$, $SnO_2$, and $Ga_2O_3$, can be used. Furthermore, a target of a mixture of oxides including more than one kind of the elements can be used.

Each of the targets as described above can be produced, for example, by a powder sintering method.

When depositing a film of such an oxide using the sputtering target, the sputtering conditions may preferably be controlled in an appropriate manner, such as gas pressure, amount of oxygen (partial pressure of oxygen), input power to be applied to a sputtering target, substrate temperature, and T-S distance (the distance between the sputtering target and the substrate) in order to increase the density of the oxide semiconductor layers as large as possible, preferably to larger than or equal to 6.0 g/cm$^3$, by compensating oxygen that desorbs out of the thin film during the deposition.

Specifically, for example, the oxide is preferably deposited by the sputtering condition described below.

The total gas pressure during film formation is preferably approximately from 1 to 3 mTorr. It is considered that when the gas pressure is lowered during film formation, sputtered atoms can be prevented from scattering one another, thereby making it possible to form a dense (high-density) film.

The amount of oxygen may preferably be controlled so that the carrier concentration (carrier density) in an oxide becomes approximately from $1\times10^{15}$ to $1\times10^{17}$/cm$^3$, which makes the oxide to a semiconductor. The amount of oxygen addition amount may appropriately be controlled according to the configuration of a sputtering system, the composition of the target used for the deposition, and fabrication process for the TFT. The ratio of oxygen was set to $O_2/(Ar+O_2)$=4% in flow rate ratio in Examples explained below.

The input power may preferably be as high as possible, and it is recommended to be set to about 2.0 W/cm$^2$ or higher in DC or RF mode.

It is recommended to control the substrate temperature in a range of approximately from room temperature to 200° C. during the film formation. Higher substrate temperature is preferable.

The density of each of the oxide is further affected by the conditions of heat treatment after the film formation, and therefore, the conditions of the heat treatment after the film formation may preferably be controlled in a proper manner. For example, the heat treatment after the film formation may be preferably conducted at roughly 250 to 400° C. for 10 minutes to about 3 hours in an air atmosphere. Such heat treatment can also be controlled, for example, in the heat history during the production process of TFTs. For example, the pre-annealing treatment (heat treatment carried out just after the patterning subsequent to the wet etching of the oxide semiconductor layer) increases the density of each of the oxide layers.

Thickness of the oxide semiconductor layer deposited in a manner described above is preferably about 10 nm or more and 200 nm or less.

The present invention also encompasses a TFT comprising the oxide as a semiconductor layer (oxide semiconductor layer) for the TFT. The TFT may comprise at least, a gate electrode, a gate insulating film, the oxide semiconductor layer, a source electrode, and a drain electrode. The structure is not particularly limited as long as they are those usually used in the field of TFT.

The density of the oxide semiconductor layer is preferably higher than or equal to 6.0 g/cm$^3$. If the density of the oxide semiconductor layer becomes large, the film quality is improved as defects in the film are decreased. Further, as the interatomic distance is decreased, the electron field-effect mobility of a TFT element is increased, the electric conductivity becomes high, and the stress stability to the light irradiation is improved. The higher the density of the oxide semiconductor layer, the more preferable. The density is more preferably higher than or equal to 6.1 g/cm$^3$, and even more preferably higher than or equal to 6.2 g/cm$^3$. It is noted here that the density of the oxide semiconductor layers were measured as described in Examples explained below in the present invention.

Next in the following, preferred embodiments of the fabrication method of TFTs are explained by referring to FIG. 1B (and further FIG. 1A). In the Examples described below, BCE type TFTs which require fewer number of process steps and are advantageous for cost reduction were fabricated as illustrated in FIG. 1B.

The figures described above and the following fabrication process demonstrate one example of preferred embodiments of the present invention, but it is not intended that the present invention be limited thereto. FIG. 1B, for example, shows a TFT structure of a bottom gate type; however, TFTs are not limited thereto, and TFTs may be those of a top gate type, having a gate insulating film and a gate electrode successively on an oxide semiconductor layer.

Figure 1B:
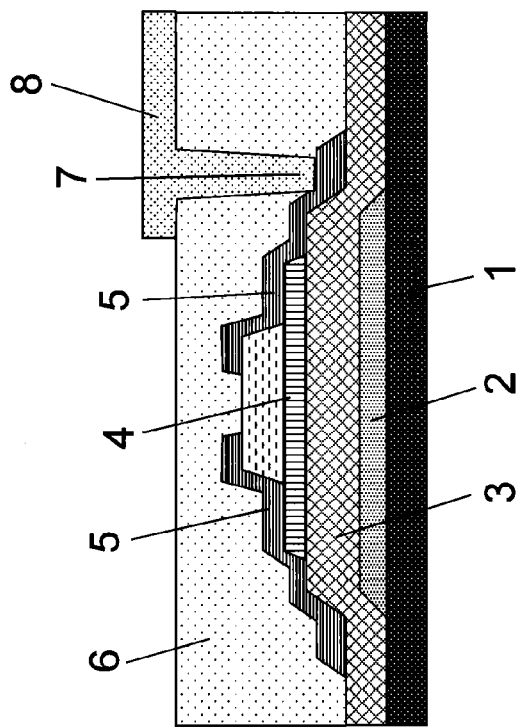
FIG. 1B is a schematic cross-sectional view for explaining a back channel etch (BCE) type TFT comprising an oxide semiconductor layer without an etch stopper layer.

As shown in FIG. 1B, a gate electrode 2 and a gate insulating film 3 are formed on the substrate 1, and an oxide semiconductor layer 4 is formed further thereon. On the oxide semiconductor layer 4, a source-drain electrode 5 is formed further thereon. A passivation film (insulating film) 6 is formed thereon, and a transparent conductive film 8 is electrically connected to the drain electrode 5 through a contact hole 7.

The method of forming the gate electrode 2 and the gate insulating film 3 on the substrate 1 is not particularly limited, and any of the methods usually used can be employed. The kinds of the gate electrode 2 and the gate insulating film 3 are not particularly limited, and those which are widely used can be adopted. For example, metals having low electrical resistivity, such as Al and Cu, refractory metals having high heat resistance, such as Mo, Cr, and Ti, and their alloys, can preferably be used for the gate electrode 2. Typical examples of the gate insulating film 3 may include a silicon oxide layer (SiO$_2$), a silicon nitride layer (SiN), and a silicon oxynitride layer (SiON). In addition, oxides such as Al$_2$O$_3$ and Y$_2$O$_3$, and their laminates may also be used.

Then, the oxide semiconductor layer 4 is formed. As described above, the oxide semiconductor layer may preferably be formed by a DC sputtering method or an RF sputtering method using a sputtering target. Alternatively, the film formation may also be carried out by a co-sputtering method in which more than one target having different compositions are simultaneously discharged.

The oxide semiconductor layer 4 is subjected to wet etching and then patterning. Just after the patterning, heat treatment (pre-annealing) may preferably be carried out for the purpose of improving the quality of the oxide semiconductor layer 4, resulting in an increase in the on-state current and field-effect mobility as the transistor characteristics and an improvement in the transistor performance.

After the pre-annealing, a source-drain electrode 5 is formed. The kind of the source-drain electrode is not particularly limited, and there can be used those which have widely been used. For example, similarly to the gate electrode, metals such as Mo, Al and Cu or their alloys, or pure Ti may be used.

The source-drain electrode 5 may be formed by, for example, a deposition of the thin film by magnetron sputtering, followed by patterning by photolithography and wet etching.

In this method, however, the oxide semiconductor layer 4 is etched to have damage during the wet etching, which causes the occurrence of defects on the surface of the oxide semiconductor layer 4, and therefore, there is a possibility that transistor characteristics may be deteriorated. For the purpose of circumventing such a problem, there has been widely used a method in which the etch stopper layer 9 such as SiO$_2$ is formed on the oxide semiconductor layer 4, as shown in FIG. 1A, to protect the oxide semiconductor layer 4. In FIG. 1A, the etch stopper layer 9 is formed and subjected to patterning before the formation of the source-drain electrode 5, so that the etch stopper layer 9 can protect the channel surface.

As another method of forming the source-drain electrode 5, there can be, for example, a method of forming the source-drain electrode 5 by a lift-off method after the formation of a metal thin-film by a magnetron sputtering. This method makes it possible to process the electrode without wet etching.

Then, the passivation film 6 is formed on the oxide semiconductor layer 4 by a CVD (Chemical Vapor Deposition) method. The surface of the semiconductor layer may easily become conductive due to plasma-induced damage by CVD (presumably because oxygen defects formed on the surface of the first oxide semiconductor act as electron donors), and therefore, $N_2O$ plasma irradiation was carried out before the formation of the passivation film in Examples described below. The conditions described in the following literature document were employed as the $N_2O$ plasma irradiation conditions.

J. Park et al., Appl. Phys. Lett., 1993, 053505 (2008)

Then, according to a conventional method, the transparent conductive film 8 is electrically connected to the drain electrode 5 through the contact hole 7. The kinds of the transparent conductive film and drain electrode are not particularly limited, and there can be used those which have usually been used. For the drain electrode, there can be used, for example, materials exemplified for the source-drain electrode described above.

The present application claims the benefit of priority based on Japanese Patent Applications No. 2012-123756 and No. 2013-073723 filed on May 30, 2012, and Mar. 29, 2013, respectively. The entire contents of the specifications of Japanese Patent Applications No. 2012-123756 and No. 2013-073723 filed on May 30, 2012, and Mar. 29, 2013, respectively, are incorporated herein by reference.

EXAMPLES

The present invention is described hereinafter more specifically by way of Examples, but the present invention is not limited to the following Examples. The present invention can be put into practice after appropriate modifications or variations within a range meeting the gist described above and below, all of which are included in the technical scope of the present invention.

Example 1

According to the method described above, TFTs having a structure depicted in FIG. 1B were fabricated. After forming a passivation film (insulating film) 6, their TFT characteristics were evaluated. In the present Example, an etch stopper layer 9 as illustrated in FIG. 1A was not formed.

First, a Mo thin film of 100 nm in thickness as a gate electrode 2 and $SiO_2$ film of 200 nm in thickness as a gate insulating film 3 were successively deposited on a glass substrate 1 ("EAGLE 2000" available from Corning Inc, having a diameter of 100 mm and a thickness of 0.7 mm). The gate electrode 2 was deposited using a pure Mo sputtering target by a DC sputtering method under the conditions: deposition temperature, room temperature; sputtering power density, 3.8 W/cm$^2$; carrier gas, Ar; gas pressure, 2 mTorr; Ar gas flow rate, 20 sccm. Further, the gate insulating film 3 was formed by a plasma CVD method under the conditions: carrier gas, a mixed gas of $SiH_4$ and $N_2O$; plasma power density, 0.96 W/cm$^2$; deposition temperature, 320° C.; and gas pressure, 133 Pa.

Next, IZGTO oxide semiconductor films of various chemical compositions shown in Table 1 were deposited to a film thickness of 40 nm by a sputtering method using sputtering targets having chemical composition corresponding to each of the oxide semiconductor layer under the conditions shown below.

Sputtering apparatus: "CS-200" available from ULVAC, Inc.
Substrate temperature: room temperature
Gas pressure: 1 mTorr
Oxygen partial pressure: $O_2/(Ar+O_2)$=4%
Film formation power: 2.55 W/cm$^2$ For the purpose of comparison, a conventional oxide thin film (IGZO of In:Ga:Zn=1:1:0.8 in atomic % ratio) of 40 nm in thickness was also deposited in the same manner as described above (No. 25 in Table 1).

The respective contents of metal elements in the oxide semiconductor film thus obtained were analyzed by an XPS (X-ray photoelectron spectroscopy) method. More specifically, after sputtering to a depth of about 5 nm from the outermost surface by Ar ion, the analysis was carried out under the conditions described below. The measurement of the oxide thin film by the XPS method was carried out using a sample having thin films each having a thickness of 40 nm formed on a Si substrate and respectively having the same compositions as the oxide semiconductor film.

X-ray source: Al K$_\alpha$
X-ray output: 350 W
Photoelectron take-off angle: 20°

After the oxide semiconductor film was deposited as described above, patterning was carried out by photolithography and wet etching. "ITO-07N" available from Kanto Chemical Co., Inc., an oxalic acid-based wet etchant solution for oxide semiconductors, was used for the wet etching. It was confirmed that each of the oxide film, including IGZO of a comparative example of No. 25 in Table 1, subjected to the experiment was properly etched without a residue by the wet etching.

After patterning of each oxide semiconductor layer, pre-annealing treatment was carried out to improve the film quality. The pre-annealing was carried out at 350° C. under air atmosphere for 1 hour.

Next, a pure Mo film of 200 nm in thickness was deposited on the oxide semiconductor layer by sputtering. The deposition condition of the Mo film was; input power of DC 300 W, gas pressure of 2 mTorr, and substrate temperature of room temperature. Subsequently, the electrode film was patterned through photolithography. Specifically, a mixed-acid etchant (phosphoric acid:nitric acid:acetic acid=70:2:10 in mass ratio) was used as the etchant for the wet etching.

After the source-drain electrode 5 was formed as described above, a passivation film 6 was formed on top of the electrode 5. As the passivation film 6, a stacked product (350 nm in total thickness) of $SiO_2$ (200 nm in thickness) and SiN (150 nm in thickness) was used. The $SiO_2$ and SiN layers were formed in a similar manner to the gate insulating film as described above. In the present Examples, the $SiO_2$ layer and the SiN layer was successively formed after making plasma treatment with $N_2O$ gas. A mixed gas of $N_2O$ and $SiH_4$ was used for the deposition of the $SiO_2$ layer, and a mixed gas of $SiH_4$, $N_2$, and $NH_3$ was used for the deposition of the SiN layer. In both cases, the film deposition power was set to 0.32 W/cm$^2$, and the film deposition temperature was set to 150° C.

Then, a contact hole 7 to be used for probing to evaluate transistor characteristics was formed in the passivation film 6 by photolithography and dry etching. Subsequently, an ITO film (80 nm in thickness) was formed as a transparent conductive film 8 by a DC sputtering method under the conditions: carrier gas, a mixed gas of argon gas and oxygen gas; film deposition power, 2.56 W/cm$^2$; and gas pressure, 5 mTorr. Thus, TFTs as shown in FIG. 1B were prepared.

Each TFT obtained as described above was subjected to evaluations as follows.

(1) Measurement of Transistor Characteristics

The transistor characteristics were measured using a semiconductor parameter analyzer, "HP4156C" available from Agilent Technologies Inc. The detailed measurement conditions were as follows:

Source voltage: 0 V
Drain voltage: 10 V
Gate voltage: from −30 to 30 V (measurement interval: 0.25 V)
Substrate temperature: room temperature (2) Threshold Voltage ($V_{th}$)

The threshold voltage is, roughly speaking, a value of the gate voltage when the transistor is shifted from the off state (the state where the drain current is low) to the on state (the state where the drain current is high). In this Example, the voltage when the drain current is around 1 nA between the on-state current and the off-state current was defined as the threshold voltage, and the threshold voltage of each TFT was measured.

The closer to 0 V, the more preferable the threshold voltage is. If the threshold voltage is on the negative side, there may be a case in which a leak current is generated even the thin film transistor is turned off. In the present Example, the respective sample was rated "A" if $V_{th}$ was larger than or equal to 0.0 V and smaller than or equal to 1.0 V, rated "B" if $V_{th}$ was larger than 1 V and smaller than or equal to 5 V, rated "C" if $V_{th}$ was smaller than 0.0 V and larger than or equal to −5 V, and rated "D" if $V_{th}$ was larger than 5 V or smaller than −5 V.

(3) Field-Effect Mobility ($\mu_{FE}$)

The field-effect mobility ($\mu_{FE}$) was derived in the saturation region where $V_d > V_g - V_{th}$ from the TFT characteristics. In the saturation region, the filed-effect mobility $\mu_{FE}$ is derived by the expression described below, in which $V_g$ and $V_{th}$ are the gate voltage and the threshold voltage, respectively; $I_d$ is the drain current; L and W are the channel length and channel width of a TFT element, respectively; $C_i$ is the capacitance of the gate insulating film; and $\mu_{FE}$ is the field-effect mobility. In the present Example, the field-effect mobility $\mu_{FE}$ was derived from the slope of a tangent of the drain current—gate voltage characteristics ($I_d$-$V_g$ characteristics) around gate voltages falling in the saturation region. In the present Example, each of the field-effect mobility ($\mu_{FE}$) measured after conducting stress evaluation described below was shown in Table 1.

$$\mu_{FE} = \frac{\partial I_d}{\partial V_g}\left(\frac{L}{C_i W(V_g - V_{th})}\right) \quad \text{[Expression 1]}$$

The field-effect mobility ($\mu_{FE}$) is related to switching speed of a thin film transistor. The higher $\mu_{FE}$, the more preferable. In the present Example, the respective sample was rated "D" if $\mu_{FE}$ was smaller than 4.9 cm$^2$/Vs, rated "B" if $\mu_{FE}$ was larger than or equal to 4.9 cm$^2$/Vs and smaller than 7.0 cm$^2$/Vs, rated "A" if $\mu_{FE}$ was larger than or equal to 7.0 cm$^2$/Vs.

(4) Stress Resistance ($\Delta V_{th}$)

In this Example, stress application tests were carried out by white light irradiation while applying negative bias to the gate electrode for simulation of environments (stress) at the time of actual panel drive. Variation of the threshold voltage before and after the stress biasing test was defined as the threshold voltage shift $\Delta V_{th}$, and employed as an index of light stress resistance in the TFT characteristics. The light stress resistance is an essential property in order to electrically drive a liquid crystal display.

The stress application test conditions were as described below.

Source voltage: 0V
Drain voltage: 10 V
Gate voltage: −20 V
Substrate temperature: 60° C.
Stress application time: 2 hours
Light source: white LED, LXHL—PW01 available from PHILLIPS N.V.

The smaller the threshold voltage shift ($\Delta V_{th}$), the more preferable. In the present Example, the respective sample was rated "A" if $\Delta V_{th}$ was smaller than 2.0 V, rated "B" if $\Delta V_{th}$ was larger than or equal to 2.0 V and smaller than or equal to 4.8 V, rated "D" if $\Delta V_{th}$ was larger than 4.8 V.

(5) Durability in Wet Etching

The durability in wet etching of respective oxide semiconductor film was evaluated by using samples described hereinbelow. Specifically, each of the oxide semiconductor film was deposited on a glass substrate. They were then subjected to a wet etching process by immersed into a wet etchant solution of phosphoric acid:nitric acid:acetic acid=70:2:10 in mass ratio at room temperature. Etching rate (in Å/sec) was determined by measuring change in thickness (amount of etching) of respective oxide semiconductor film before and after the wet etching for a predetermined period of time. The kind of the glass substrate and the deposition conditions of the oxide semiconductor layers used for the evaluation of the stress resistance were the same as those of employed in the fabrication of the TFT described above.

In the present Example, the respective sample was rated "B (pass)" if the etching rate was smaller than or equal to 1 Å/sec, and rated "D (fail)" if the etching rate was larger than 1 Å/sec. The oxide semiconductor thin film satisfying the pass criterion is excellent in terms of the TFT characteristics and the stress resistance as the surface (a side of back channel) of the oxide semiconductor film was neither etched nor damaged during the wet etching process of the source-drain electrode.

(6) Measurement of Density of Oxide Film

The density of each oxide film in some of the samples was measured by XRR (X-ray reflectivity method). The detailed measurement conditions were as described below.

Analysis apparatus: Horizontal type X-ray diffraction apparatus Smart Lab available from Rigaku Co., Ltd.
Target: Cu (source: Kα ray)
Target output power: 45 kV-200 mA
Preparation of Measurement Samples:

Each sample was prepared by forming a film (having a thickness of 100 nm) of each oxide having each composition on a glass substrate under the sputtering conditions described below, and then carrying out the same heat treatment as the pre-annealing treatment in the TFT production process described above.

Sputtering gas pressure: 1 mTorr, 3 mTorr or 5 mTorr
Oxygen partial pressure: 100×O$_2$/(Ar+O$_2$)=2%
Power density: DC 2.55 W/cm$^2$
Heat treatment: at 350° C. for 1 hour in an air atmosphere (7) Measurement of Carrier Density Using some of the samples, carrier density in the oxide films was measured by the van der Pauw method using a Hall effect measurement apparatus "Resitest 8310" available from Toyo Corp. The samples for the Hall effect measurements were prepared as follows. Each oxide semiconductor film having a thickness of 200 nm was deposited in 5 mm square in size on a glass substrate by a mask sputtering method, followed by formation of Mo electrodes at the four corners of the square pattern of the oxide semiconductor film again by a mask sputtering method. A lead wire was connected to each of the four electrodes using electrically conductive paste. The carrier density was determined by measurement of electrical resistivity and Hall coefficient. The Hall measurement was carried out at room temperature under a magnetic field of 0.5 T.

The results except for the film density and carrier density are summarized in Table 1. Notation "-" in the Table indicates that the TFT did not show switching in the measurement.

In Table 1, each of the measured characteristics has two columns: one for measured value and the other for evaluation. The rightmost column in Table 1 is for total evaluation, and each sample was rated "A" if it has three or more "A" without "D", rated "B" if it has two or less "A" without "D", and rated "D" if it has one or more "D" among the properties of the threshold voltage, the stress resistance, the field-effect mobility, and the wet etching property.

The results of IGZO film used for comparison are also shown in No. 25 line of Table 1.

The results shown in Table 1 may be analyzed as follows.

Nos. 1 to 5, 7, 11 to 13, 15 to 17, and 20 to 22 were examples which satisfied all of the requirements specified in the present invention, showing excellent in all the properties, and were rated A or B in the total evaluation column in the Table. Among the examples, Nos. 1 and 4 satisfied the relationships defined by the expressions (5) to (8), which is a preferred embodiment of the present invention, and showed particularly excellent characteristics as rated A in the total evaluation column in the Table.

Among the examples, Nos. 1 and 2 had film density of 6.14 g/cm$^3$ and 6.11 g/cm$^3$, respectively, satisfying the acceptance criterion of the present invention (larger than or equal to 6.0 g/cm$^3$). It is noted here that all the examples other than Nos. 1 and 2 also satisfied the acceptance criterion.

Among the examples, Nos. 1, 2, and 4 had carrier density of $4.0 \times 10^{15}$/cm$^3$, $2.3 \times 10^{16}$/cm$^3$, and $1.5 \times 10^{15}$/cm$^3$, respectively, satisfying the acceptance criterion of the present invention (from $1 \times 10^{15}$/cm$^3$ to $1 \times 10^{17}$/cm$^3$). It is noted here that all the examples other than Nos. 1, 2, and 4 also satisfied the acceptance criteria.

On the contrary, samples which did not fulfill any of the requirements specified in the present invention did not satisfy all of the desired properties.

Nos. 6, 8, 10, 14, 18, and 23 were examples in which the oxide semiconductor did not satisfy the expression (1) specified in the present invention. The stress resistance was deteriorated in these samples. No. 19 was an example in which the oxide semiconductor did not satisfy the expression (2) specified in the present invention. The mobility was deteriorated in the sample. No. 24 was an example in which

TABLE 1

| No. | Sn | Zn | In | Ga | Left side value of expression (1) | Left side value of expression (2) | Threshold voltage $V_{th}$ Measured value (V) | | Stress resistance $\Delta V_{th}$ Measured value (V) | | Field-effect mobility $\mu_{FE}$ Measured value (cm$^2$/Vsec) | | Resistance to wet etching Measured value (Å/sec) | | Total evaluation |
|---|---|---|---|---|---|---|---|---|---|---|---|---|---|---|---|
| | | | | | | | Measured value (V) | Evaluation | Measured value (V) | Evaluation | (cm$^2$/Vsec) | Evaluation | value (Å/sec) | Evaluation | |
| 1 | 19.4 | 47.2 | 16.6 | 16.8 | 106.9 | 139.7 | 0.0 | A | 1.8 | A | 7.9 | A | 0.0 | B | A |
| 2 | 8.9 | 53.3 | 21.1 | 16.7 | 116.9 | 131.1 | 0.0 | A | 2.7 | B | 17.3 | A | 0.0 | B | B |
| 3 | 7.5 | 64.4 | 13.8 | 14.3 | 131.4 | 121.1 | 2.0 | B | 3.5 | B | 14.5 | A | 0.5 | B | B |
| 4 | 23.5 | 48.6 | 12.5 | 15.3 | 106.9 | 141.2 | 1.0 | A | 1.8 | A | 7.9 | A | 0.0 | B | A |
| 5 | 18.4 | 53.7 | 10.8 | 17.2 | 118.3 | 129.4 | 0.6 | A | 2.0 | B | 7.2 | A | 0.0 | B | B |
| 6 | 16.9 | 29.8 | 34.0 | 19.2 | 81.9 | 158.8 | −1.0 | C | 6.3 | D | 19.6 | A | 0.0 | B | D |
| 7 | 10.1 | 46.2 | 27.7 | 16.0 | 103.9 | 143.1 | −0.6 | C | 2.2 | B | 18.1 | A | 0.0 | B | B |
| 8 | 34.8 | 42.6 | 9.6 | 13.0 | 92.9 | 155.8 | 1.4 | B | 5.5 | D | 6.5 | B | 0.0 | B | D |
| 9 | 4.2 | 75.6 | 4.2 | 16.0 | 153.0 | 100.6 | — | — | — | — | — | — | 46.0 | D | D |
| 10 | 20.7 | 32.6 | 25.8 | 20.9 | 89.3 | 150.6 | 1.0 | A | 5.8 | D | 9.5 | A | 0.0 | B | D |
| 11 | 7.0 | 50.9 | 19.8 | 22.3 | 122.1 | 120.7 | 0.0 | A | 4.0 | B | 7.1 | A | 0.2 | B | B |
| 12 | 5.5 | 59.2 | 11.3 | 24.1 | 139.1 | 104.3 | 0.0 | A | 4.5 | B | 7.7 | A | 0.3 | B | B |
| 13 | 15.7 | 49.6 | 7.8 | 26.8 | 127.7 | 111.1 | 0.6 | A | 0.8 | A | 6.3 | B | 0.0 | B | B |
| 14 | 5.6 | 27.0 | 38.3 | 29.1 | 93.6 | 138.2 | −1.0 | C | 7.8 | D | 14.2 | A | 0.2 | B | D |
| 15 | 8.0 | 35.8 | 29.2 | 27.0 | 104.8 | 130.7 | 0.6 | A | 3.4 | B | 13.5 | A | 0.1 | B | B |
| 16 | 22.8 | 38.0 | 15.2 | 24.0 | 103.5 | 135.0 | 0.0 | A | 3.6 | B | 12.5 | A | 0.0 | B | B |
| 17 | 6.0 | 45.0 | 18.0 | 31.0 | 126.9 | 107.4 | 0.0 | A | 3.0 | B | 10.3 | A | 0.5 | B | B |
| 18 | 15.4 | 24.1 | 27.7 | 32.8 | 95.0 | 133.2 | 1.0 | A | 5.5 | D | 8.0 | A | 0.0 | B | D |
| 19 | 10.6 | 49.1 | 5.0 | 35.3 | 140.9 | 90.7 | 4.0 | B | 0.8 | A | 2.3 | D | 0.0 | B | D |
| 20 | 16.1 | 27.3 | 18.6 | 38.0 | 109.0 | 115.5 | 2.0 | B | 3.1 | B | 7.4 | A | 0.0 | B | B |
| 21 | 30.6 | 30.6 | 6.8 | 32.0 | 104.5 | 125.7 | 1.0 | A | 1.8 | A | 6.5 | B | 0.0 | B | B |
| 22 | 16.3 | 42.3 | 6.5 | 35.0 | 129.0 | 101.3 | 1.0 | A | 1.5 | A | 5.4 | B | 0.0 | B | B |
| 23 | 31.5 | 21.4 | 14.1 | 33.0 | 90.9 | 136.5 | 0.0 | A | 7.6 | D | 7.2 | A | 0.0 | B | D |
| 24 | 1.9 | 52.9 | 8.2 | 37.0 | 150.2 | 80.9 | 4.0 | B | 8.0 | D | 1.9 | D | 31.0 | D | D |
| 25 | 0 | 28.6 | 35.7 | 35.7 | 107.4 | 119.4 | 1.0 | A | 7.5 | D | 8.0 | A | 22.0 | D | D |
| 26 | 3.5 | 18.9 | 42.1 | 35.5 | 90.8 | 133.9 | −2.0 | C | 8.8 | D | 15.0 | A | 19.0 | D | D |
| 27 | 4.2 | 41.9 | 25.0 | 28.9 | 118.2 | 117.1 | 0.5 | A | 7.0 | D | 11.0 | A | 18.0 | D | D | the oxide semiconductor did not satisfy the expression (4) due to small value of [Sn] and the expression (2) specified in the present invention. The stress resistance, mobility, and durability in wet etching were deteriorated in the sample.

No. 9 was an example having a small value of [Sn] insufficient to satisfy the relationship defined by the expression (4). The durability in wet etching was deteriorated. The poor durability in wet etching also resulted in damaging surface of the oxide semiconductor, turning it electrically conductive which made the TFT to lose the switching characteristics. The mobility, $V_{th}$, and $\Delta V_{th}$ could not be measured (marked "-" in Table 1) in the example.

Further, the wet etching property was deteriorated in No. 25 which had poor stress resistance and did not satisfy the relationship defined by the expression (4) as it did not include Sn.

Simulating a chemical composition of IZGTO described in Patent Document 1, sample No. 26 was prepared and evaluated. It was an example having both a small value of [Sn] insufficient to satisfy the relationship defined by the expression (4) and an excessively large value of [In] to satisfy the relationships defined by the expressions (3) and (1). The durability in wet etching and the stress resistance were deteriorated.

No. 27 was an example having a small value of [Sn]. The durability in wet etching was deteriorated and the stress resistance was degraded. It is considered that damage was caused in the back channel region of the oxide semiconductor due to the deterioration of the durability in wet etching in the example.

Figure 3B:
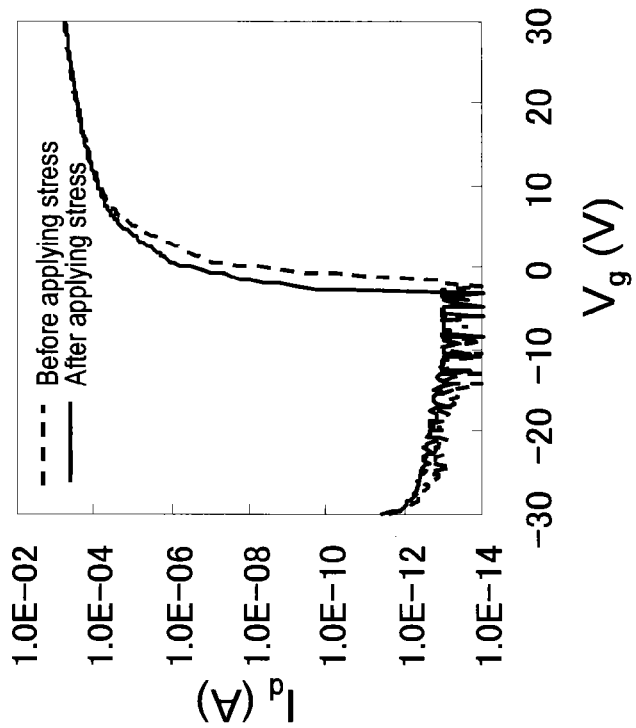
FIG. 3B is the evaluation of the light stress resistance of the TFT which was fabricated by using an oxide semiconductor 1 (present invention examples) in Example 1.
Figure 3A:
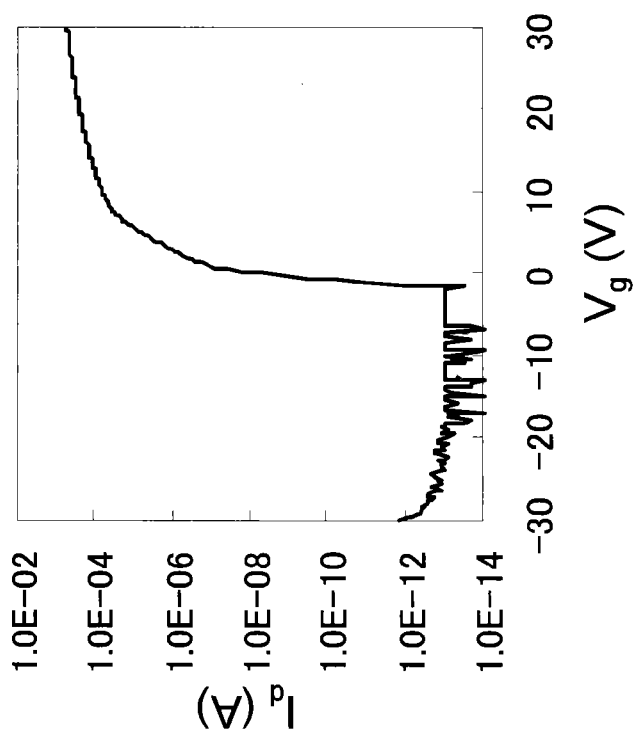
FIG. 3A is a graph plot showing $I_d$-$V_g$ characteristics of the TFT which was fabricated by using an oxide semiconductor 1 (present invention examples) in Example 1.

For the purpose of reference, $I_d$-$V_g$ characteristics and stress resistance to the light irradiation were measured for a TFT comprising an oxide semiconductor layer of the IZGTO film of an inventive example of No. 1 in Table 1, and the acquired data were shown in FIG. 3A and FIG. 3B, respectively.

The $I_d$-$V_g$ characteristics were acquired by measuring values of drain current while sweeping the gate bias from −30 V to 30 V under the source and drain bias of 0 V and 10 V, respectively. As shown in FIG. 3A, with increasing the gate bias from the negative to the positive side, the drain current $I_d$ showed rapid increase around $V_g$=0 V. It was thus demonstrated that the TFT comprising the IZGTO film of the present invention showed a favorable switching characteristics by the transition from the off-state of low drain current to the on-state of high drain current. The various characteristics of the transistor were derived from the $I_d$-$V_g$ characteristics shown in FIG. 3A as follows; the threshold voltage $V_{th}$=0.0 V, the field-effect mobility $\mu_{FE}$=7.9 cm²/Vs (see No. 1 in Table 1), the S value=0.3 V/decade (not shown in Table 1).

Result of the evaluation of the light stress resistance is summarized in FIG. 3B. As described above, white light was irradiated onto the TFTs while applying a negative bias to the gate electrode in the present Example. Negative shift of the threshold voltage with time was observed as holes generated by the light irradiation were trapped within the semiconductor itself or at the interface between the semiconductor layer and the gate insulating film. The absolute value of the threshold voltage shift due to the light stress was found 1.8 V in FIG. 3B.

Figure 4A:
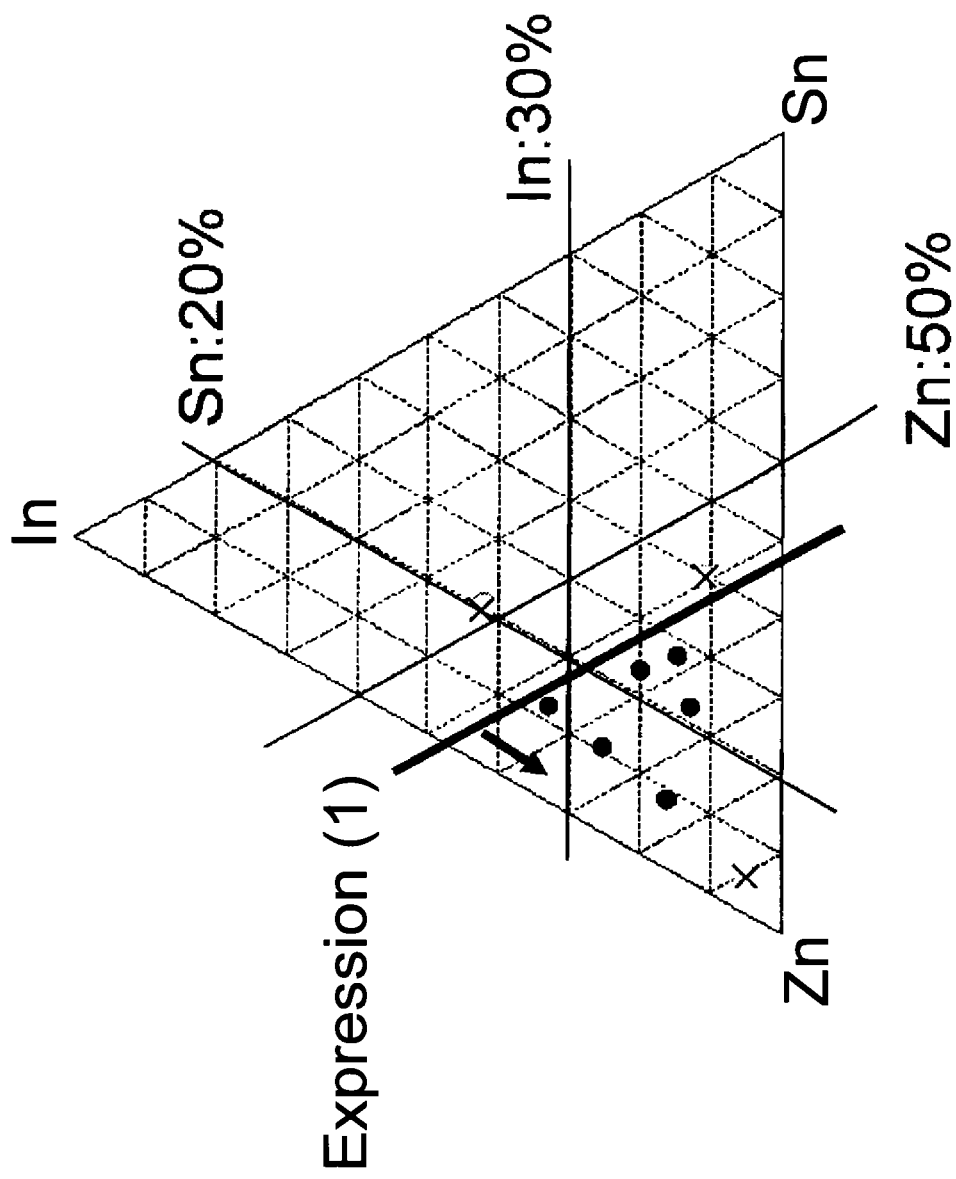
FIG. 4A is an In—Zn—Sn phase diagram with data points of Nos. 1 to 9 of Table 1 ([Ga] is larger than or equal to 10 atomic % but smaller than 20 atomic %) in Example 1, indicating a region satisfying the relationship specified by the expression (1) by an arrow.
Figure 4B:
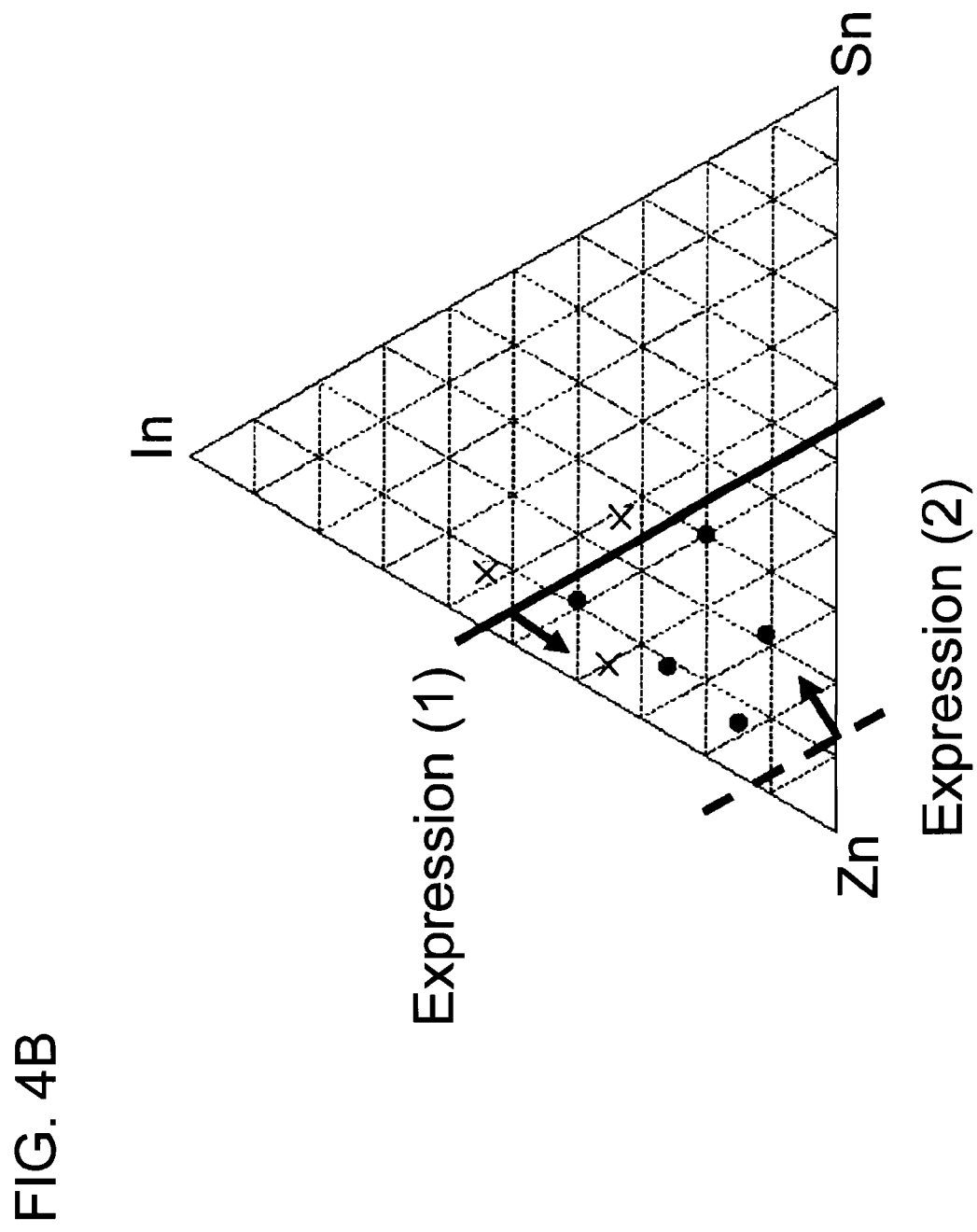
FIG. 4B is an In—Zn—Sn phase diagram with data points of Nos. 10 to 16 of Table 1 ([Ga] is larger than or equal to 20 atomic % but smaller than 30 atomic %) in Example 1, indicating a region satisfying the relationship specified by the expressions (1) and (2) by arrows.

Shown in FIG. 4 are In—Zn—Sn phase diagrams indicating atomic ratios of three elements of In, Zn, and Sn in IZGTO of various contents of Ga which are shown in Nos. 1 to 24 of Table 1. The region satisfying the requirements of the expressions (1) and (2) is indicated in each of the diagram. Nos. 1 to 9 in which the content of Ga ([Ga]) was larger than or equal to 10 atomic % but smaller than 20 atomic % are plotted in FIG. 4A. Nos. 10 to 16 in which [Ga] was larger than or equal to 20 atomic % but smaller than 30 atomic % are plotted in FIG. 4B. Nos. 17 to 24 in which [Ga] was larger than or equal to 30 atomic % but smaller than 40 atomic % are plotted in FIG. 4C. In the respective diagram, samples which satisfy the requirements of the present invention are indicated as "•" while those which do not satisfy the requirements are shown as "×".

By taking particular note of the mobility, a downward trend was observed with increasing the content of Ga ([Ga]) as seen in FIG. 4A to FIG. 4C. Further, presence of excessive Zn relatively decreases the contents of In and Sn which provide conduction paths for electrons, resulting in decrease of mobility in the oxide semiconductor. Therefore, the expression (2) may be considered indirectly indicating the upper limits of Zn and Ga to satisfy the mobility. As such, the region satisfying the relationship defined by the expression (2) is narrowed with increasing the content of Ga in FIG. 4. For example, No. 19 comprising Ga of 35.5% and No. 24 comprising Ga of 37.0% having large contents and being positioned to higher Zn region in the In—Zn—Sn phase diagram of FIG. 4C, did not satisfy the relationship defined by the expression (2) and the mobility was decreased. It was found that the mobility is decreased in the oxide semiconductors of higher Ga content and in the region on the side of higher Zn content in the In—Zn—Sn phase diagram.

By taking particular note of the stress resistance, a downward trend was observed for the stress resistance as indicated by increase of $\Delta V_{th}$ in a region of the In—Zn—Sn phase diagrams where the contents of In and Sn are relatively high as for Nos. 6 and 10, for example. It was also found that the range of the region including high Zn contents, in which the stress resistance was high, was increased with the increase of Ga content. This is due to the effect of Ga which stabilizes chemical bonding with oxygen and hence reduces oxygen deficiencies in the oxide semiconductor. With the increase of Ga content, the range of In:Sn:Zn which satisfies the relationship defined by the expression (1) was broadened. It was also indicated that Zn, as for Ga, also has the effect of stabilizing the amorphous structure of the oxide semiconductor and hence enhancing the stress resistance in a region of high Zn content.

Example 2

In this Example, a relationship between [Sn], the content of Sn relative to the total content of all the metal elements and the wet etching rate was investigated for IZGTO. A wet etching test was carried out in a similar manner to Example 1.

Specifically, oxide thin films having various Sn ratios to all the metals constituting IGZTO while keeping the chemical composition ratio of metal elements other than Sn constant (In:Ga:Zn=20:30:50 in atomic %) were prepared. The thin films were deposited by sputtering method using sputtering targets containing different ratios of Sn.

Figure 5:
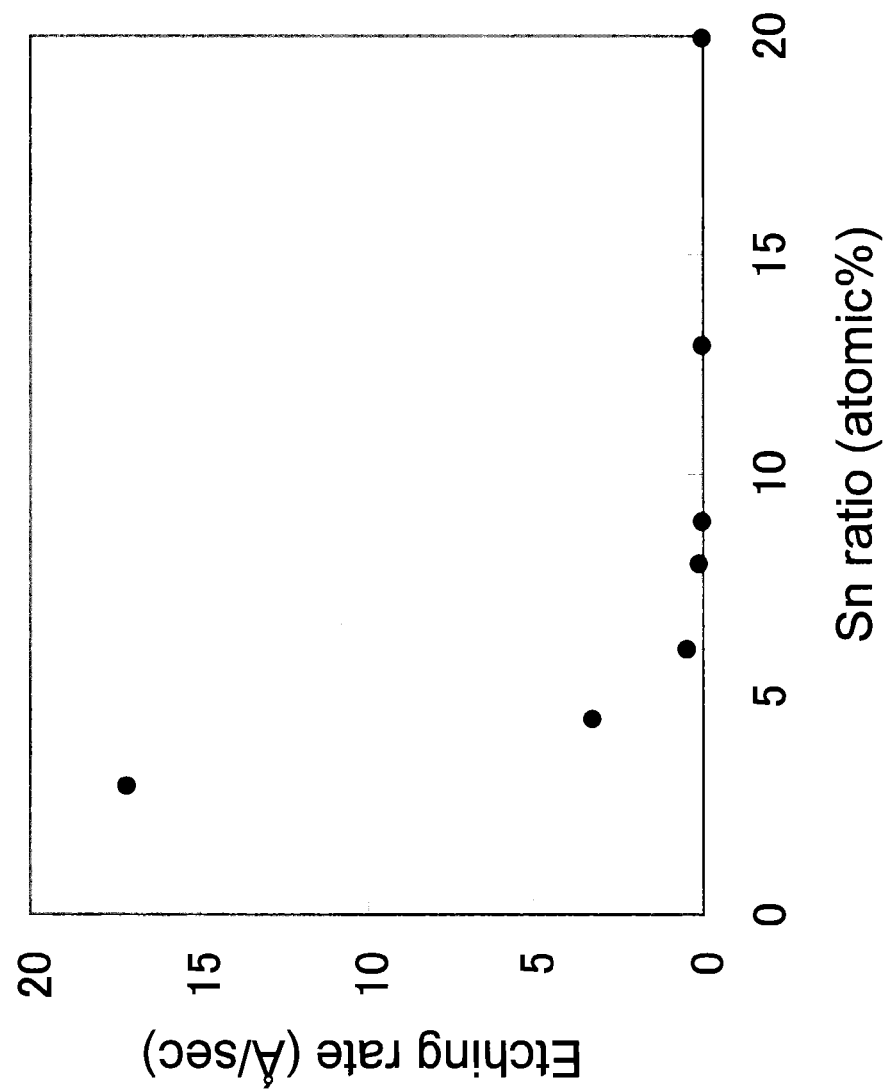
FIG. 5 is a graph plot showing the result of Example 2 in which the effect of contained amount of Sn relative to all the metal elements in In—Ga—Zn—Sn—O to wet etching rate of the source-drain electrode.

The results are shown in FIG. 5. The abscissa of FIG. 5 is the content of Sn relative to the total content of all the metal elements [Sn], and the ordinate represents the wet etching rate.

As depicted in FIG. 5, the wet etching rate showed a rapid increase when the content of Sn was smaller than 5%. On the other hand, when the content of Sn is larger than or equal to 5%, the wet etching rate was very small, indicating that the oxide thin film was not etched.

EXPLANATION OF REFERENCE NUMERALS

1 Substrate
2 Gate electrode

3 Gate insulating film
4 Oxide semiconductor layer
5 Source-drain electrode
6 Passivation film (insulator layer)
7 Contact hole
8 Transparent conductive film
9 Etch stopper layer

The invention claimed is:

1. An oxide semiconductor configured to be used as a semiconductor layer in a thin film transistor comprising;
a substrate, a gate electrode on the substrate, a gate insulating film on the gate electrode, a semiconductor layer on the gate insulting film, a source electrode contacting the semiconductor layer and the gate insulating film, a drain electrode contacting the semiconductor layer and the gate insulating film, and a passivation film formed thereon,
wherein the oxide comprises In, Zn, Ga, Sn, and O; and satisfies requirements (1), (2), (3), and (4):

$$(1.67 \times [Zn] + 1.67 \times [Ga]) \geq 100 \quad (1)$$

$$\{([Zn]/0.95) + ([Sn]/0.40) + ([In]/0.4)\} \geq 100 \quad (2)$$

$$[In] \leq 40 \quad (3)$$

$$[Sn] \geq 5 \quad (4)$$

wherein [In], [Zn], [Ga], and [Sn] represent, in atomic %, the content of each of the elements relative to the total content of all the metal elements other than oxygen in the oxide.

2. The oxide semiconductor according to claim 1, further satisfying (5), (6), (7), and (8):

$$12 \leq [In] \leq 20 \quad (5)$$

$$17 \leq [Sn] \leq 25 \quad (6)$$

$$15 \leq [Ga] \leq 20 \quad (7)$$

$$40 \leq [Zn] \leq 50. \quad (8)$$

3. The oxide semiconductor according to claim 1, having a carrier density from $1 \times 10^{15}$ to $1 \times 10^{17}/cm^3$.

4. A thin film transistor comprising the oxide semiconductor according to claim 1 as a semiconductor layer.

5. The thin film transistor according to claim 4 wherein the density of the oxide semiconductor is larger than or equal to 6.0 $g/cm^3$.

6. A display device comprising the thin film transistor according to claim 5.

7. A display device comprising the thin film transistor according to claim 4.

8. A sputtering target suitable to form the oxide semiconductor according to claim 1;
comprising In, Zn, Ga, Sn, and O; and
satisfying requirements (1), (2), (3), and (4):

$$(1.67 \times [Zn] + 1.67 \times [Ga]) \geq 100 \quad (1)$$

$$\{([Zn]/0.95) + ([Sn]/0.40) + ([In]/0.4)\} \geq 100 \quad (2)$$

$$[In] \leq 40 \quad (3)$$

$$[Sn] \geq 5 \quad (4)$$

wherein [In], [Zn], [Ga], and [Sn] represent, in atomic %, the content of each of the elements relative to the total content of all the metal elements other than oxygen in the oxide.

9. The sputtering target according to claim 8 further satisfying (5), (6), (7), and (8):

$$12 \leq [In] \leq 20 \quad (5)$$

$$17 \leq [Sn] \leq 25 \quad (6)$$

$$15 \leq [Ga] \leq 20 \quad (7)$$

$$40 \leq [Zn] \leq 50. \quad (8)$$

* * * * *